US010782653B2

(12) United States Patent
Hirokubo

(10) Patent No.: US 10,782,653 B2
(45) Date of Patent: Sep. 22, 2020

(54) ACTUATOR APPARATUS, ELECTRONIC DEVICE, AND CONTROL METHOD

(71) Applicant: Seiko Epson Corporation, Tokyo (JP)

(72) Inventor: Nozomu Hirokubo, Fujimi (JP)

(73) Assignee: Seiko Epson Corporation (JP)

(*) Notice: Subject to any disclaimer, the term of this patent is extended or adjusted under 35 U.S.C. 154(b) by 61 days.

(21) Appl. No.: 16/023,240

(22) Filed: Jun. 29, 2018

(65) Prior Publication Data

US 2018/0321643 A1 Nov. 8, 2018

Related U.S. Application Data

(62) Division of application No. 14/699,183, filed on Apr. 29, 2015, now abandoned.

(30) Foreign Application Priority Data

May 1, 2014 (JP) ................................ 2014-094606

(51) Int. Cl.
*G02B 5/28* (2006.01)
*G05B 11/14* (2006.01)
(Continued)

(52) U.S. Cl.
CPC .............. *G05B 11/14* (2013.01); *G01J 3/027* (2013.01); *G01J 3/10* (2013.01); *G01J 3/26* (2013.01);
(Continued)

(58) Field of Classification Search
CPC ...... G02B 26/001; G02B 5/286; G02B 5/288; G01J 3/26
(Continued)

(56) References Cited

U.S. PATENT DOCUMENTS 5,142,414 A 8/1992 Koehler
5,751,469 A 5/1998 Arney et al.
(Continued)

FOREIGN PATENT DOCUMENTS

CN 101256258 A 9/2008
EP 2 367 035 A1 9/2011
(Continued)

OTHER PUBLICATIONS

Extended European Search Report for Application No. EP 13 16 7619 dated Aug. 20, 2013 (11 pages).
(Continued)

*Primary Examiner* — Audrey Y Chang
(74) *Attorney, Agent, or Firm* — Harness, Dickey & Pierce, P.L.C.

(57) ABSTRACT

An actuator apparatus includes a pair of substrates facing each other; a plurality of bias actuators that each vary a gap dimension of a gap between the pair of substrates; a gap detection portion that detects the gap dimension; and a voltage control unit that controls driving of each of the bias actuators on the basis of the detected gap dimension. The bias actuators are located asymmetric relative to a driving central axis and are mutually independently driven; and the voltage control unit derives driving parameters for use in driving the bias actuators, on the basis of voltages and gap dimensions obtained by sequentially switching and driving the bias actuators on by one.

9 Claims, 11 Drawing Sheets

(51) Int. Cl.
*H02N 1/00* (2006.01)
*G01J 3/26* (2006.01)
*G02B 26/00* (2006.01)
*G01J 3/10* (2006.01)
*G01J 3/02* (2006.01)
*G01J 3/50* (2006.01)

(52) U.S. Cl.
CPC .............. *G01J 3/505* (2013.01); *G02B 5/286* (2013.01); *G02B 5/288* (2013.01); *G02B 26/001* (2013.01); *H02N 1/006* (2013.01); *B81B 2201/031* (2013.01)

(58) Field of Classification Search
USPC ................. 359/578, 579, 260; 356/454, 402
See application file for complete search history.

(56) References Cited

U.S. PATENT DOCUMENTS

| | | |
|---|---|---|
| 5,808,781 A | 9/1998 | Arney et al. |
| 6,084,334 A | 7/2000 | Yamamoto et al. |
| 6,747,775 B2 | 6/2004 | Little |
| 7,212,292 B2 | 5/2007 | Van Brockl et al. |
| 7,265,477 B2 | 9/2007 | Wan |
| 7,368,846 B2 | 5/2008 | Mushika et al. |
| 7,635,939 B2 | 12/2009 | Mushika et al. |
| 8,081,314 B2 | 12/2011 | Kamihara |
| 9,297,997 B2 | 3/2016 | Sano |
| 9,389,350 B2 | 7/2016 | Hirokubo |
| 2003/0034542 A1 | 2/2003 | Okumura |
| 2003/0123125 A1 | 7/2003 | Little |
| 2004/0100678 A1 | 5/2004 | Chang et al. |
| 2004/0207377 A1 | 10/2004 | Shimada et al. |
| 2006/0244975 A1 | 11/2006 | VanBrocklin et al. |
| 2007/0171531 A1 | 7/2007 | Nakamura |
| 2008/0239494 A1* | 10/2008 | Zander ................ G02B 26/001 359/578 |
| 2009/0306479 A1 | 12/2009 | Kamihara |
| 2010/0004511 A1 | 1/2010 | Kamihara |
| 2010/0022840 A1 | 1/2010 | Yasuda |
| 2010/0103522 A1 | 4/2010 | Matsumoto |
| 2010/0225255 A1 | 9/2010 | Franke |
| 2011/0222157 A1 | 9/2011 | Sano |
| 2011/0222158 A1 | 9/2011 | Sano |
| 2011/0228397 A1 | 9/2011 | Matsushita |
| 2012/0200926 A1 | 8/2012 | Matsushita |
| 2012/0206813 A1* | 8/2012 | Bahat ..................... G01J 3/26 359/578 |
| 2012/0300208 A1* | 11/2012 | Sano ....................... G01J 1/04 356/402 |
| 2013/0279005 A1 | 10/2013 | Sano |
| 2013/0308134 A1 | 11/2013 | Hirokubo |
| 2014/0218586 A1 | 8/2014 | Sano |
| 2015/0212313 A1 | 7/2015 | Hirokubo |

FOREIGN PATENT DOCUMENTS

| | | |
|---|---|---|
| EP | 2 369 398 A1 | 9/2011 |
| EP | 2664947 A1 | 11/2013 |
| EP | 2687832 A1 | 1/2014 |
| JP | 59-170912 A | 9/1984 |
| JP | 01-094312 A | 4/1989 |
| JP | 401094312 A | 4/1989 |
| JP | 07-243963 A | 9/1995 |
| JP | 09-236760 | 9/1997 |
| JP | 11-136974 A | 5/1999 |
| JP | 2002-277758 A | 9/2002 |
| JP | 2003-101138 | 4/2003 |
| JP | 2003-140064 A | 5/2003 |
| JP | 2003-215473 A | 7/2003 |
| JP | 2004-170899 A | 6/2004 |
| JP | 2004-258385 A | 9/2004 |
| JP | 2007-086517 A | 4/2007 |
| JP | 2008-183350 A | 8/2008 |
| JP | 2008-211894 A | 9/2008 |
| JP | 2011-106936 A | 6/2011 |
| JP | 2011-191492 A | 9/2011 |
| JP | 2011-191554 A | 9/2011 |
| JP | 2012-163664 | 8/2012 |
| JP | 2012-168362 | 9/2012 |
| JP | 2012-198268 | 10/2012 |
| JP | 2013-072930 A | 4/2013 |
| JP | 2013-088601 A | 5/2013 |
| JP | 2013-218194 A | 10/2013 |
| JP | 2013-222122 A | 10/2013 |
| JP | 2013-238755 A | 11/2013 |
| JP | 2014-059497 A | 4/2014 |
| WO | WO-02-086582 A1 | 10/2002 |
| WO | WO-2004-041710 | 5/2004 |

OTHER PUBLICATIONS

Extended European Search Report for Application No. EP 15 15 2295 dated Jun. 18, 2015 (7 pages).
Extended European Search Report for Application No. EP 14 15 3779 dated May 6, 2014 (5 pages).

* cited by examiner

ACTUATOR APPARATUS, ELECTRONIC DEVICE, AND CONTROL METHOD

CROSS-REFERENCE TO RELATED APPLICATIONS

This is a Divisional Application of U.S. application Ser. No. 14/699,183, filed Apr. 29, 2015, which claims priority to Japanese Patent Application No. 2014-094606, filed May 1, 2014, both of which are hereby expressly incorporated by reference herein in their entireties.

BACKGROUND

1. Technical Field

The present invention relates to an actuator apparatus, an electronic device, a control method, and the like.

2. Related Art

Heretofore, there have been well known wave variable interference filters including a pair of substrates facing each other; reflecting films constituted of two groups of at least one reflecting film that are each disposed on a corresponding one of the pair of substrates and that face each other; and electrodes (electrostatic actuators) constituted of two groups of at least one electrode that are each disposed on a corresponding one of the pair of substrates and that face each other (refer to, for example, JP-A-2003-215473).

In a Fabry-Perot etalon filter disclosed in JP-A-2003-215473, four electrostatic actuators that can be mutually independently driven are disposed in an area surrounding a pair of reflecting films, and each of the electrostatic actuators is connected to a detector. Further, for each of the electrostatic actuators, electrostatic capacitance is detected by the detector and a driving voltage to be supplied to the relevant electrostatic actuator is controlled by a gap controller on the basis of the detected electrostatic capacitance. Consequently, this configuration makes it possible to perform feedback control such that the parallelism between the reflecting films is kept on the basis of the gap dimension for each of the electrostatic actuators.

In the Fabry-Perot etalon filter disclosed in JP-A-2003-215473, nevertheless, electrostatic capacitance for each of the electrostatic actuators is detected by the detector, and this configuration leads to a problem in that the detector is required to incorporate detection circuits each associated with a corresponding one of the electrostatic actuators.

SUMMARY

An advantage of some aspects of the invention is that an actuator apparatus, an electronic device, and a control method are provided, which make it possible to perform gap control using a plurality of electrostatic actuators with high accuracy.

An actuator apparatus according to a first example of application of the invention includes a pair of substrates facing each other; a plurality of electrostatic actuators that each vary a gap dimension of a gap between the pair of substrates; a gap detection portion that detects the gap dimension; and a driving control means that controls driving of each of the plurality of electrostatic actuators. Further, the plurality of electrostatic actuators are mutually independently driven, and the driving control means derives at least one driving parameter for use in driving each the plurality of electrostatic actuators on the basis of a voltage supplied to each of the plurality of electrostatic actuators and a gap dimension detected by the gap detection portion at a time of the supply of the voltage thereto.

In the above first example of application, each of the electrostatic actuators is sequentially driven. When a constant voltage is supplied to one of the electrostatic actuators, in the case where the gap dimension of a gap between electrodes constituting the relevant electrostatic actuator is large, the magnitude of electrostatic attractive force is smaller, thereby making a variation amount of the gap dimension detected by the gap detection portion smaller, as compared with a case where the gap dimension of the gap between the electrodes is small. Thus, a variation amount of the gap dimension for each of the electrostatic actuators is obtained by supplying a constant voltage to each of the electrostatic actuators to drive the relevant electrostatic actuator and obtaining a gap dimension detected by the gap detection portion at the time of the supply of the voltage thereto, and the obtained variation amount of the gap dimension for each of the electrostatic actuators makes it possible to obtain a state of relative inclination between the pair of substrates as well as a relative inclination amount. Accordingly, it is possible to easily calculate the at least one driving parameter for use in driving each of the electrostatic actuators in order to keep the pair of substrates in a desired attitude (for example, in a mutually parallel state), from the state of relative inclination between the pair of substrates as well as the relative inclination amount.

Further, in the first example of application, a variation amount of the gap dimension with respect to each of the electrostatic actuators is obtained by using a single gap detection portion, and thus, it is possible to simplify the configuration more easily, as compared with a configuration in which gap dimensions each associated with a gap between electrodes constituting a corresponding one of the electrostatic actuators are detected.

Here, the gap dimension of a gap between the pair of substrates means, for example, the dimension of a gap between the surface of one of the pair of substrates and the surface of the other one of the pair of substrates, or the distance between members, such as reflecting films, each provided on a corresponding one of the pair of substrates.

In an actuator apparatus according to a second example of application of the invention, preferably, in the first example of application, the driving control means derives a parallel control voltage for keeping the pair of substrates in a mutually parallel state, as a driving parameter of the at least one driving parameter for use in driving each the plurality of electrostatic actuators.

In the above second example of application, the driving control means derives a parallel control voltage (a driving voltage) to be supplied to each of the electrostatic actuators, as a driving parameter of the at least one driving parameter. Thus, the supply of the derived driving voltage to each of the electrostatic actuator makes it possible to keep the pair of substrates in a mutually parallel state.

In an actuator apparatus according to a third example of application of the invention, preferably, in the second example of application, when supplying a voltage to each of the plurality of electrostatic actuators so that the each of the plurality of electrostatic actuators causes each of at least one of the pair of substrates to bend toward the other one of the pair of substrates and thereby vary the gap dimension, the driving control means derives a spring contact of the pair of substrates for the each of the plurality of electrostatic actuators and an initial gap dimension of a gap between electrodes constituting the each of the plurality of electrostatic actuators, as driving parameters of the at least one parameter for use in driving the each of the plurality of electrostatic actuators, and further, the driving control means drives the parallel control voltage as a driving parameter of the at least one driving parameter for use in driving the each of the plurality of electrostatic actuators, on the basis of the spring contact and the initial gap dimension.

In the above third example of application, a spring contact of the pair of substrates in an area in which each of the electrostatic actuators is provided and an initial gap dimension of a gap between electrodes constituting each of the electrostatic actuators are calculated on the basis of a voltage supplied to the each of electrostatic actuators and a gap dimension detected by the gap detection portion at the time of the supply of the voltage thereto.

That is, in the above third example of application, through a method of supplying a plurality of voltages to an electrostatic actuator that is sequentially selected from the electrostatic actuators, a distribution of the spring contacts with respect to the pair of substrates as well as the initial gap dimension for each of the electrostatic actuators can be calculated by means of an easy set of simultaneous equations. Thus, the use of the spring contacts and the initial gap dimensions make it possible to easily derive the parallel control voltages, each of which is to be supplied to a corresponding one of the electrostatic actuators in order to keep the pair of substrates in a mutually parallel state in which the gap dimension of the gap therebetween is kept to a constant value.

In an actuator apparatus according to a fourth example of application of the invention, preferably, in the second example of application, a control electrostatic actuator is further provided; the plurality of electrostatic actuators operate as bias electrostatic actuators each supplied with a bias voltage; the control electrostatic actuator is driven independently of the bias electrostatic actuators; and the driving control means supplies each of the bias electrostatic actuators with the parallel control voltage as the bias voltage, and supplies the control electrostatic actuator with a feedback voltage corresponding to a gap dimension detected by the gap detection portion.

In the above fourth example of application, the pair of substrates are kept in a mutually parallel state through a method of supplying each of the above parallel control voltages to a corresponding one of the plurality of electrostatic actuators, as each of the bias voltages to be supplied thereto. Further, a feedback voltage is supplied to the control electrostatic actuator on the basis of the gap dimension of a gap detected by the gap detection portion and a target value of the gap dimension of a gap between the pair of substrates. In this way, it is possible to set the gap dimension of a gap between the pair of substrates to a desired target value with high accuracy.

Here, as described above in JP-A-2003-215473, a voltage to be supplied to each of the plurality of electrostatic actuators is feedback controlled on the basis of the gap dimension of a gap between electrodes constituting the each of the plurality of electrostatic actuators. In this configuration, unfortunately, interactions among the individual electrostatic actuators make it difficult to perform the feedback control. In contrast thereto, in the above fourth example of application, first, the pair of substrates are brought into a mutually parallel state by driving each of the bias electrostatic actuators on the basis of a gap dimension detected by a single gap detection portion, and then, the control electrostatic actuator is feedback controlled. Thus, when driving each of the bias electrostatic actuators, the calculation of a feedback voltage in view of the interactions is unnecessary, and thus, it is possible to easily perform feedback control using a simply configured circuit.

In an actuator apparatus according to a fifth example of application of the invention, preferably, in the first example of application, the gap detection portion detects a gap dimension of a gap between portions of the pair of substrates, the portions being located on a driving central axis in a plan view.

In the above fifth example of application, the gap detection portion detects a gap dimension of a gap between portions of the pair of substrates, the portions being located on a driving central axis in a plan view. That is, the at least one driving parameter is calculated on the basis of the gap dimension of a gap between portions of the pair of substrates, the portions being required to be gap-controlled with the highest accuracy. Thus, in the above fifth example of application, it is possible to achieve not only to keep the pair of substrates in a mutually parallel state, but also to perform control with high accuracy such that the gap dimension of a gap between the pair of substrates becomes equal to a desired value.

In an actuator apparatus according to a sixth example of application of the invention, preferably, in the first example of application, a first reflecting film is provided on one of the pair of substrates and a second reflecting film is provided on the other one of the pair of substrates so as to face the first reflecting film.

In the above sixth example of application, the actuator apparatus is a Fabry-Perot etalon (an interference filter) provided with a pair of reflecting films (the first reflecting film and the second reflecting film). In such an interference filter, it is necessary to keep the pair of reflecting films in a mutually parallel state in order to cause the interference filter to transmit light rays of a desired wavelength with high accuracy. In this regard, in the above sixth example of application, as described above, since the at least one parameter for use in driving each of the electrostatic parameters is derived by the driving control means, the pair of reflecting films can be kept in a mutually parallel state with high accuracy, thereby enabling the actuator apparatus (interference filter) to transmit light rays with high resolution.

In an actuator apparatus according to a seventh example of application, preferably, in the sixth example of application, the first reflecting film and the second reflecting film are provided such that a center point of the first reflecting film as well as a center point of the second reflecting film is located on the driving central axis in a plan view.

In the above seventh example of application, the reflecting films are provided such that the center points of the reflecting films are located on the driving central axis in a plan view. That is, the reflecting films are provided at portions of the pair of substrates, at which the degree of parallelization is higher than any other position of the pair of substrates. Thus, the pair of reflecting films can be brought into a mutually parallel state with further certainty, thereby enabling the actuator apparatus (interference filter) to transmit light rays with higher resolution.

Further, in the case where, as described in the above fifth example of application, the gap detection portions are located on the driving central axis in a plan view, it becomes possible for the gap detection portion to directly detect the gap dimension of a gap between the reflecting films. Thus, the gap dimension of a gap between the reflecting films can be set to a target value with high accuracy on the basis of the detected gap dimension, thereby enabling the actuator apparatus (interference filter) to transmit, with high resolution, light rays of a desired target wavelength.

An electronic device according to an eighth example of application of the invention includes the actuator apparatus according to the first example of application; and a processing control unit that designates a target value of the gap dimension to thereby control the actuator apparatus, and the driving control means derives the parameter for use in driving each of the plurality of electrostatic actuators on the basis of the voltage supplied to each of the plurality of electrostatic actuators, the gap dimension detected by the gap detection portion at a time of the supply of the voltage thereto, and the target value.

In the above eighth example of application, as described above, the actuator apparatus is capable of controlling the gap dimension of a gap between the pair of substrates on the basis of the instruction from the processing control unit with respect to a target value of the gap dimension. In this case, similarly to the above examples of application, in order to keep the pair of substrates in a mutually parallel state, the driving control means derives the at least parameter for use in driving each of the electrostatic actuators. Thus, in the electronic device according to the above eight example of application, it is possible to set the gap dimension of a gap between the pair of substrates to a desired target value under a situation where the parallelism between the pair of substrates is kept with high accuracy.

A control method for an actuator apparatus, according to a ninth example of application of the invention includes supplying each of a plurality of electrostatic actuators with a voltage; detecting, by a gap detection portion, a gap dimension of a gap between a pair of substrates every time each of the plurality of electrostatic actuators is supplied with the voltage; and deriving a driving parameter for driving each of the plurality of electrostatic actuators on the basis of the voltage supplied to each of the plurality of electrostatic actuators and the gap dimension at a time of the supply of the voltage thereto.

In the above ninth example of application, similarly to the above examples of application, the gap dimension of a gap between the pair of substrates is detected by the gap detection portion, and thus, it is possible to simplify the configuration more easily, as compared with a configuration in which gap dimensions each associated with a gap between electrodes constituting a corresponding one of the electrostatic actuators are detected. Further, it is possible to keep the pair of substrates in a mutually parallel state by deriving the at least one driving parameter for use in driving each of the electrostatic actuators.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment according to the invention will be described with reference to the drawings.
Configuration of Spectroscopic Measurement Apparatus FIG. 1 is a block diagram illustrating an outline configuration of a spectroscopic measurement apparatus according to a first embodiment of the invention.

A spectroscopic measurement apparatus 1 is an embodiment of an electronic device according to the invention, and is an apparatus for analyzing the intensity of light rays of each of predetermined wave lengths and measuring dispersed spectra with respect to measurement-target light rays having been reflected at a measurement target X. In addition, in an example described in this embodiment, light rays reflected at the measurement target X are handles as measurement-target light rays, but when a light emitting object, such as a liquid crystal display, is used, light rays emitted from the light emitting object may be handled as measurement-target light rays.

Figure 1:
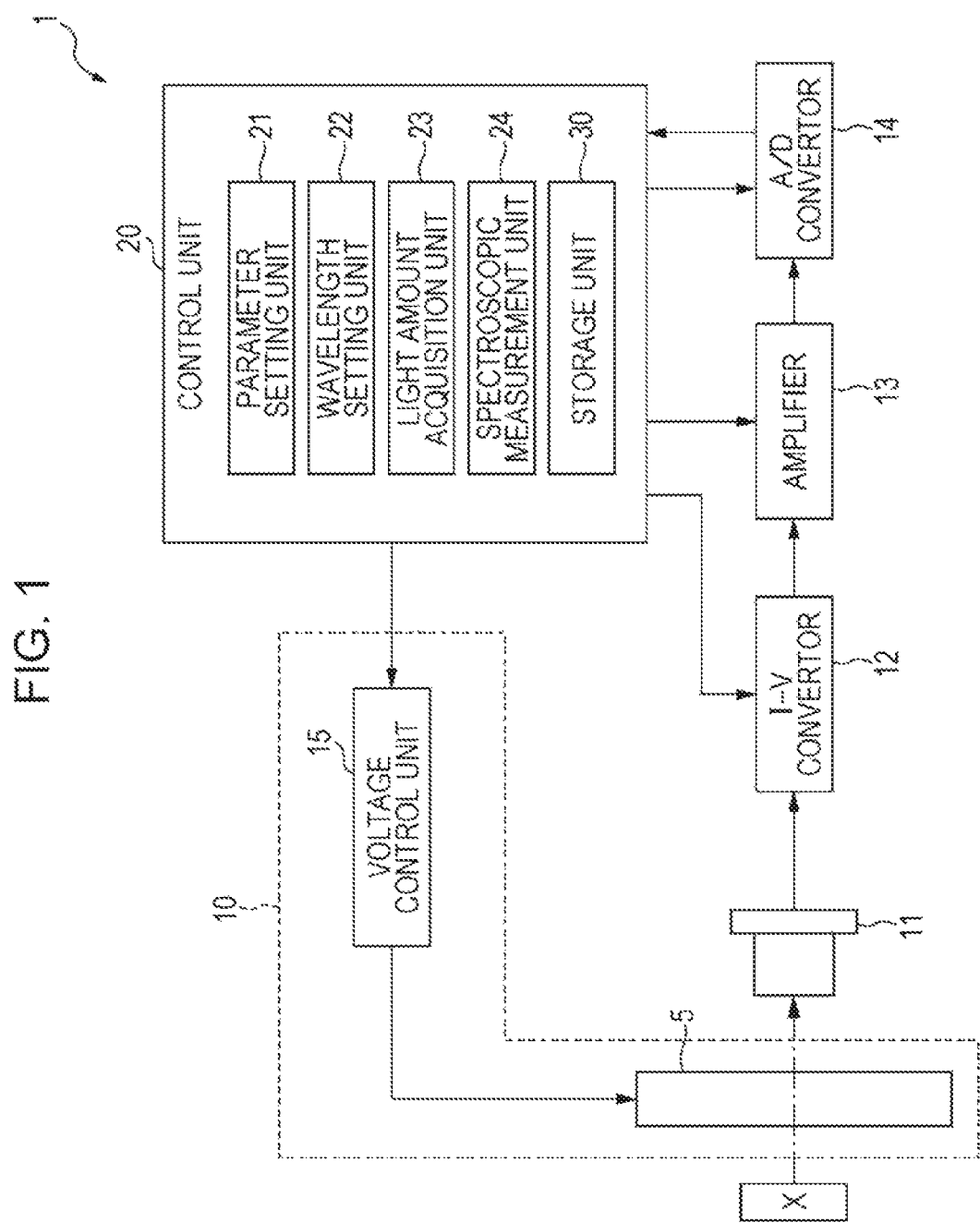
FIG. 1 is a block diagram illustrating an outline configuration of a spectroscopic measurement apparatus according to a first embodiment of the invention.

As shown in FIG. 1, the spectroscopic measurement apparatus 1 includes an optical module 10, which is an embodiment of an actuator apparatus according to the invention; a detector 11 (a detection portion); an I-V convertor 12; an amplifier 13; an A/D convertor 14; and a control unit 20. Further, the optical module 10 includes a wavelength variable interference filter 5 and a voltage control unit 15.

The detector 11 receives light rays having been transmitted through the wavelength variable interference filter 5 included in the optical module 10, and outputs a detection signal (electric current) in accordance with the light intensity of the received light rays.

The I-V convertor 12 converts the detection signal having been input from the detector 11 into a voltage signal, and outputs the voltage signal to the amplifier 13.

The amplifier 13 amplifies the voltage signal (detection voltage signal) corresponding to the detection signal having been input from the I-V convertor 12.

The A/D convertor 14 converts the detection voltage signal (an analogue signal) having been input from the amplifier 13 into a digital signal, and outputs the digital signal to the control unit 20.

The voltage control unit 15 drives the wavelength variable interference filter 5 to transmit light rays of each of predetermined target wavelengths under control of the control unit 20.

Configuration of Optical Module

Next, the configuration of the optical module 10 will be described below.

Figure 2:
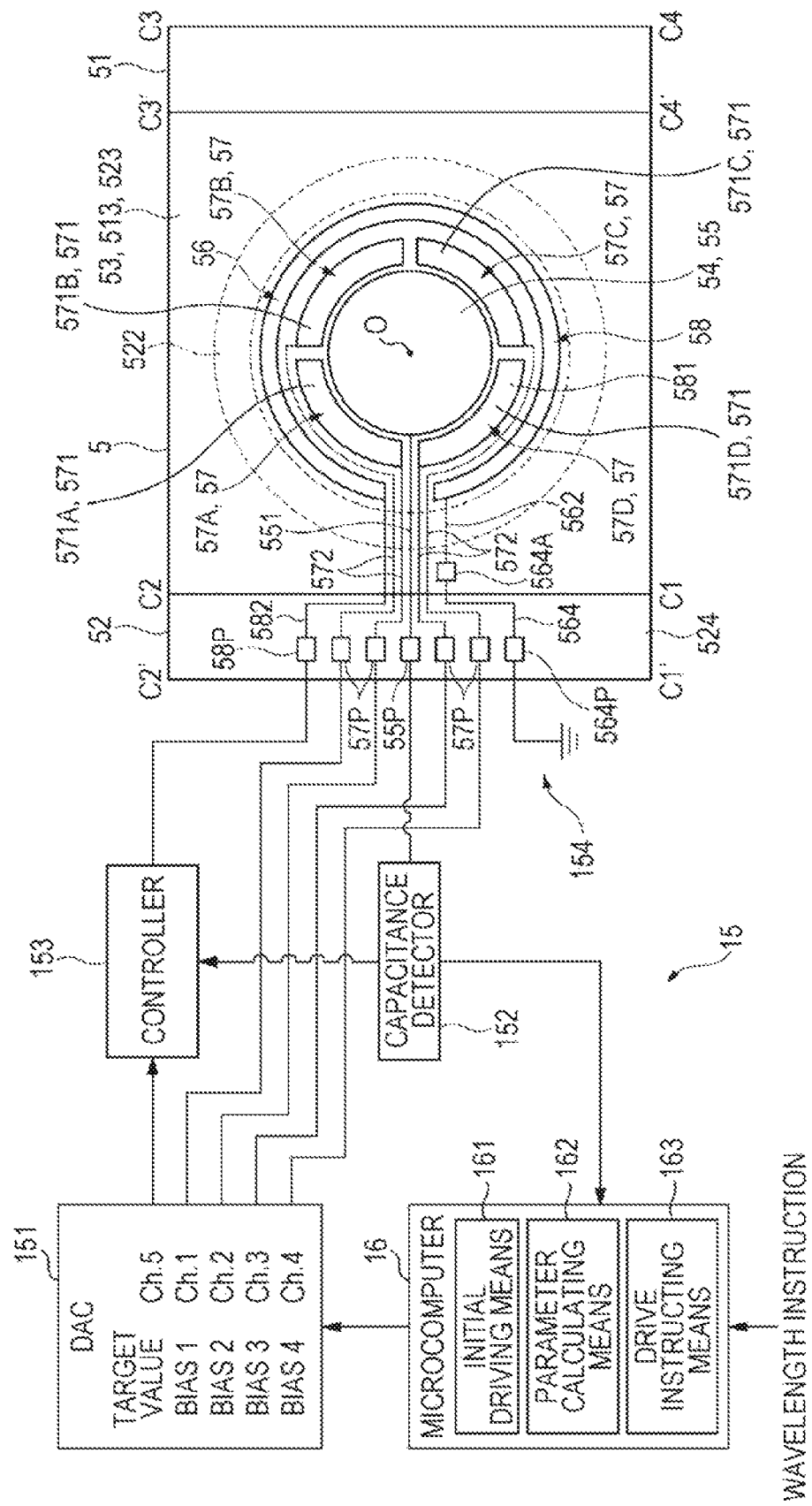
FIG. 2 is a block diagram illustrating an outline configuration of an optical module according to a first embodiment of the invention.

FIG. 2 is a block diagram illustrating an outline configuration of the optical module 10.

As described above, the optical module 10 includes the wavelength variable interference filter 5 and the voltage control unit 15.

Configuration of Wavelength Variable Interference Filter

Figure 3:
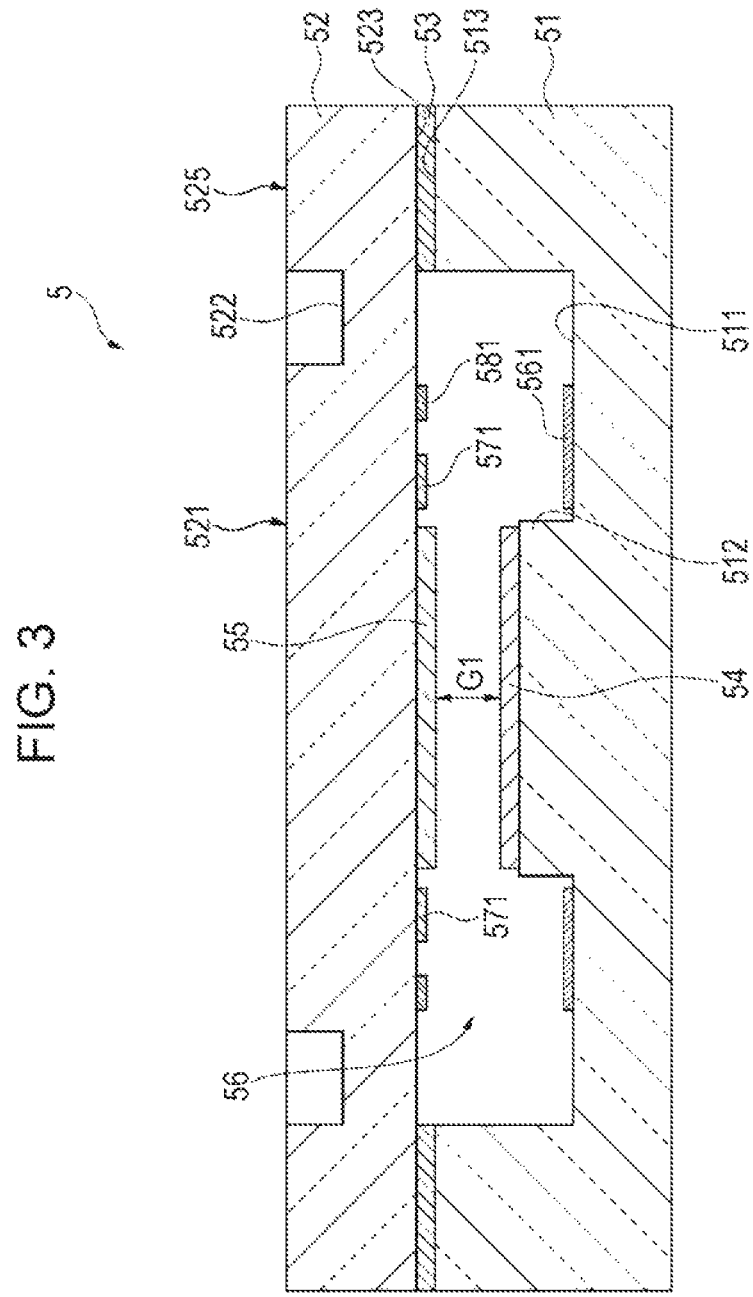
FIG. 3 is a cross-sectional view of a wavelength variable interference filter according to a first embodiment of the invention.
Figure 4:
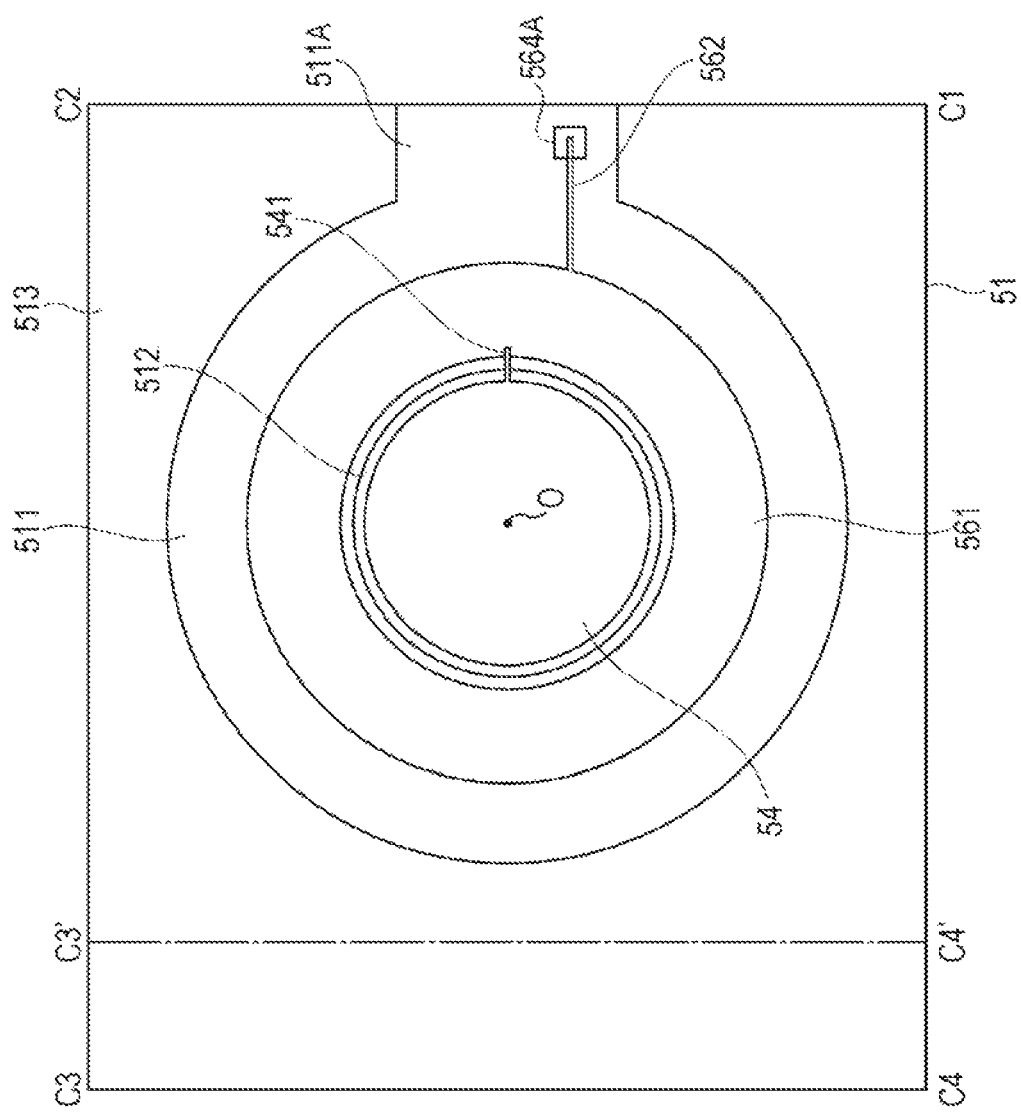
FIG. 4 is a plan view of a fixed substrate according to a first embodiment of the invention when the fixed substrate is viewed from the side of a movable substrate according to a first embodiment of the invention.
Figure 5:
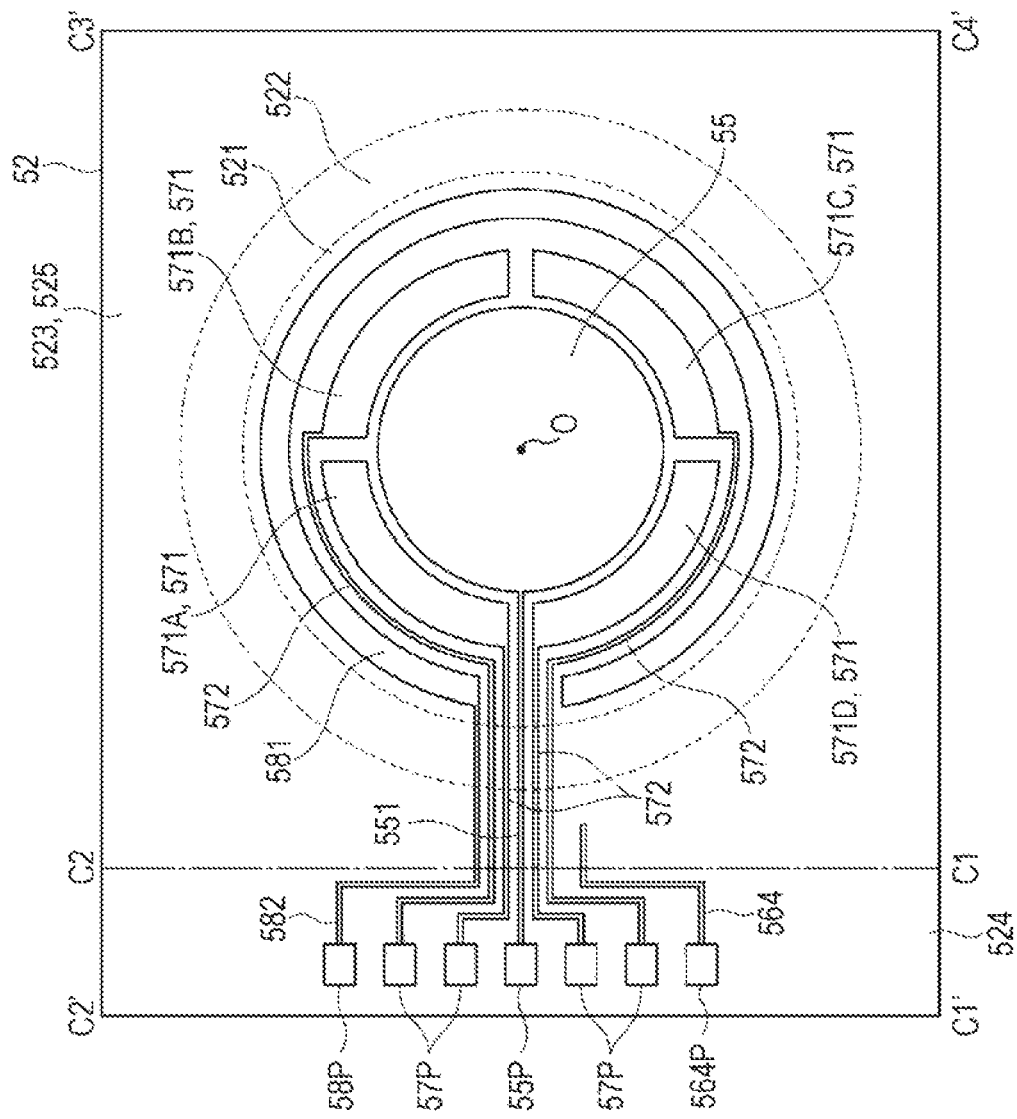
FIG. 5 is a plan view of a movable substrate according to a first embodiment of the invention when the movable substrate is viewed from the side of a fixed substrate according to a first embodiment of the invention.

The wavelength variable interference filter 5 of the optical module 10 will be described below. FIG. 3 is a cross-sectional view illustrating an outline configuration of the wavelength variable interference filter 5. FIG. 4 is a plan view of a fixed substrate 51 when the fixed substrate 51 is viewed from the side of a movable substrate 52. FIG. 5 is a plan view of the movable substrate 52 when the movable substrate 52 is viewed from the side of the fixed substrate 51.

As shown in FIGS. 2 and 3, the wavelength variable interference filter 5 includes the fixed substrate 51, which corresponds to one of a pair of substrates included in an actuator apparatus according to the invention, and the movable substrate 52, which corresponds to the other one of a pair of substrates included in an actuator apparatus according to the invention. These fixed substrate 51 and movable substrate 52 are each formed of one of various glass materials, a liquid crystal material, or the like, and are integrally configured by bonding a first bonding portion 513 of the fixed substrate 51 to a second bonding portion 523 of the movable substrate 52 by using a bond film 53 constituted by a plasma-polymerized film mainly made of siloxane.

The fixed substrate 51 is provided with a fixed reflecting film 54, which corresponds to a first reflecting film included in an actuator apparatus according to the invention; and the movable substrate 52 is provided with a movable reflecting film 55, which corresponds to a second reflecting film included in an actuator apparatus according to the invention. These fixed reflecting film 54 and movable reflecting film 55 are disposed so as to face each other via a reflecting-film-to-reflecting-film gap G1 (refer to FIG. 3).

The wavelength variable interference filter 5 includes an electrostatic actuator portion 56 for use in adjusting (changing) the gap dimension of the reflecting-film-to-reflecting-film gap G1. The electrostatic actuator portion 56 includes four bias electrostatic actuators 57 (57A, 57B, 57C, and 57D) that can be mutually independently driven, as well as a control electrostatic actuator 58. In addition, hereinafter, the bias electrostatic actuators 57 (57A, 57B, 57C, and 57D) and the control electrostatic actuator 58 will be sometimes shortened into bias actuators (57A, 57B, 57C, and 57D) and a control actuator 58, respectively.

Further, one of substrate-end edges of the fixed substrate 51 (i.e., a side C3-C4 shown in FIGS. 2 and 4) projects outward from one of substrate-end edges of the movable substrate 52 (i.e., a side C3'-C4' shown in FIGS. 2 and 5). The other one of substrate-end edges of the movable substrate 52 (i.e., a side C1'-C2' shown in FIGS. 2 and 5) projects outward from the other one of the substrate-end edges of the fixed substrate 51 (i.e., a side C1-C2 shown in FIGS. 2 and 4), and the face of the projecting portion of the fixed substrate side of the movable substrate 52 forms an electric wiring face 524.

In addition, in the following description, a plan view viewed in a substrate-thickness direction of the fixed substrate 51 or the movable substrate 52, that is, a plan view of the wavelength variable interference filter 5 when the wavelength variable interference filter 5 is viewed in a lamination direction in which the fixed substrate 51, the bond film 53, and the movable substrate 52 are laminated, will be referred to as a filter plan view. Further, in this embodiment, the center point of the fixed reflecting film 54 coincides with the center point of the movable reflecting film 55 in the filter plan view, and the center points of these reflecting films in a plan view will be referred to as filter center points O. A straight line passing through the center points O of the reflecting films 54 and 55 corresponds to a driving central axis of an actuator apparatus according to the invention.

Configuration of Fixed Substrate

As shown in FIG. 4, the fixed substrate 51 includes an electrode arrangement groove 511 and a reflecting film arrangement portion 512 that are formed by means of, for example, etching.

The electrode arrangement groove 511 is formed in the shape of a ring whose center point is placed on the filter center point O of the fixed substrate 51 in the filter plan view. The reflecting film arrangement portion 512 is formed so as to, in the filter plan view, project to the side of the movable substrate 52 from the central portion of the electrode arrangement groove 511. A common electrode 561 constituting the electrostatic actuator portion 56 is disposed on a groove bottom face of the electrode arrangement groove 511. Further, the fixed reflecting film 54 is disposed on the projecting apical face of the reflecting film arrangement portion 512.

Further, an electrode pulling-out groove 511A extending from the electrode arrangement groove 511 toward the side C1-C2 of the fixed substrate 51 is provided in the fixed substrate 51.

The common electrode 561 is provided on the groove bottom face of the electrode arrangement groove 511. The common electrode 561 is provided in an area constituting the groove bottom face of the electrode arrangement groove 511 and facing a movable portion 521 described below. Specifically, as shown in FIG. 3, the common electrode 561 is provided so as to cover an area facing bias electrodes 571 and a control electrode 581, these electrodes being described below. Further, the configuration may be made such that an insulating film is layer-stacked on the common electrode 561 in order to ensure the insulation between the common electrode 561 and individual electrodes provided at the side of the movable substrate 52.

Further, a common pulling-out electrode 562 connected to the outer circumference of the common electrode 561 is provided in the fixed substrate 51. This common pulling-out electrode 562 is provided along the electrode pulling-out groove 511A. A bump portion 564A, which is provided so as to project to the side of the movable substrate 52, is provided on the electrode pulling-out groove 511A, and the common pulling-out electrode 562 extends onto the bump portion 564A. Further, the common pulling-out electrode 562 comes into contact with a common connection electrode 564, which is provided at the side of the movable substrate 52, on the bump portion 564A, and is electrically connected to the common connection electrode 564. This common connection electrode 564 extends from an area facing the electrode pulling-out groove 511A up to the electric wiring face 524, and forms a common electrode pad 564P on the electric wiring face 524.

As described above, the reflecting film arrangement portion 512 is formed substantially in the shape of a cylinder having the same central axis as that of the electrode arrangement groove 511, and having a diameter whose dimension is smaller than that of the diameter of the electrode arrangement groove 511, and the fixed reflecting film 54 is provided on a partial face constituting the face of the reflecting film arrangement portion 512, and facing the movable substrate 52.

The fixed reflecting film 54 can be realized by employing a metallic film, such as an Ag film, or an alloyed film having electrical conductivity, such as an Ag alloy film. Further, the fixed reflecting film 54 may be realized by employing a dielectric multi-layer film including a high refraction layer made of $TiO_2$ and a low refraction layer made of $SiO_2$. In this case, it is preferable that the dielectric multi-layer film is formed of a metal alloy film having electrical conductivity, as the lowest layer thereof or the surface layer thereof.

Further, as shown in FIG. 4, a fixed mirror connecting electrode 541, which extends from the outer circumference of the fixed reflecting film 54, is provided in the fixed substrate 51. As shown in FIG. 4, the fixed mirror connection electrode 541 is connected to the common electrode 561.

In addition, in the case where the fixed reflecting film 54 is composed of an electrically conductive member made of metal, alloyed metal, or the like, it is possible to realize the fixed mirror connection electrode 541 and the fixed reflecting film 54 by using the same material. Further, the fixed mirror connection electrode 541 may be provided separately from the fixed reflecting film 54.

In contrast, in the case where the fixed reflecting film 54 is composed of an insulating member, such as a dielectric multi-layer film, the configuration may be made such that a fixed mirror electrode composed of a material having translucency, such as an ITO material, is formed in the form of a film on the reflecting film 54, and a portion of the fixed mirror electrode is used as the fixed mirror connecting electrode 541, or the fixed mirror connection electrode 541 connected to the fixed mirror electrode is newly provided. This method enables the fixed reflecting film 54 to also function as an electrode.

Configuration of Movable Substrate

The movable substrate 52 includes, in the filter plan view as shown in FIG. 5, the movable portion 521 having the shape of a circle whose center point is placed on the filter center point O; a holding portion 522 having the same central axis as that of the movable portion 521 and having the function of holding the movable portion 521; and a substrate outer circumference portion 525 provided at the outer side of the holding portion 522.

The movable portion 521 is formed so as to have a thickness whose dimension is larger than that of thickness of the holding portion 522. For example, in this embodiment, the dimension of the thickness of the movable portion 521 is formed so as to be equal to that of the thickness of the movable substrate 52. The movable portion 521 is formed so as to, in the filter plan view, have a diameter whose dimension is at least larger than the dimension of the diameter of the outer circumference edge of the reflecting film arrangement portion 512. Further, the movable reflecting film 55, the four bias electrodes 571, and the control electrode 581 are provided in the movable portion 521.

The movable reflecting film 55 is provided at the central portion of the movable portion 521 so as to face the fixed reflecting film 54 via the reflecting-film-to-reflecting-film gap G1. The movable reflecting film 55 is realized by using a reflecting film having the same configuration as that of the fixed reflecting film 54 described above.

Further, similarly to the fixed reflecting film 54, the movable reflecting film 55 is electrically connected to a movable mirror connection electrode 551. The movable mirror connection electrode 551 extends to the electric wiring face 524 through an area facing the electrode pulling-out groove 511A, and the extending edge portion of the movable mirror connection electrode 551 forms a mirror electrode pad 55P that is electrically connected to the voltage control unit 15. The mirror electrode pad 55P is electrically connected to a capacitance detector 152 of the voltage control unit 15.

In this embodiment, the fixed reflecting film 54 and the movable reflecting film 55 also function as electrodes, and the gap dimension of the gap G1 can be detected by detecting electrostatic capacitance between the fixed reflecting film 54 and the movable reflecting film 55. That is, the fixed reflecting film 54 and the movable reflecting film 55 constitute a portion of a gap detection portion included in an actuator apparatus according to the invention.

As shown in FIG. 5, the four bias electrodes 571 (571A, 571B, 571C, and 571D) are provided so as to be, on the same circumference of a virtual circle whose center point is placed on the filter center point O, rotationally symmetric relative to a virtual central axis perpendicularly passing through the filter center point O. Each of the bias electrodes 571 is electrically connected to a corresponding one of bias connection electrodes 572. Further, the bias connection electrodes 572 extend to the electric wiring face 524, and the extending edge portion of each of the bias connection electrodes 572 forms a corresponding one of bias electrode pads 57P. Each of the bias electrode pads 57P is electrically connected to a corresponding one of bias channels Ch. 1 to 4 of a digital-to-analog converter (DAC) 151 of the voltage control unit 15.

Here, in this embodiment, the common electrode 561 and each of the bias electrodes 571 constitute a corresponding one of bias actuators 57. As described above, each of the bias electrodes 571 is electrically connected to a corresponding one of the mutually different bias channels, and thus, the bias actuators 57 can be driven mutually independently.

Further, as shown in FIG. 2, the bias actuators 57 are disposed so as to be, on the same circumference of a circle whose center point is placed on the filter center point O, rotationally symmetric relative to a driving central axis perpendicularly passing through the filter center point O. In other words, as a result, the individual bias actuators are configured so as to be asymmetric relative to the driving central axis perpendicularly passing through the filter center point O.

As shown in FIG. 5, the control electrode 581 is provided at the outer side (i.e., at the side of the holding portion 522) of the bias electrodes 571. The control electrode 581 is formed, for example, substantially in the shape of "C" (in a shape resulting from notching part of a circular ring). The aforementioned individual bias connection electrodes 572 and movable mirror connection electrode 551 are pulled out to the electric wiring face 524 though the C-shaped opening of the control electrode 581.

The control electrode 581 is electrically connected to a control connection electrode 582, which extends to the electric wiring face 524, and the extending edge portion of the control connection electrode 582 forms a control electrode pad 58P.

The control electrode pad 58P is electrically connected to a controller 153 of the voltage control unit 15.

As described above, in the movable substrate 52, the common connection electrode 564 is provided so as to extend from an area facing the electrode pulling-out groove 511A to the electric wiring face 524. The common connecting electrode 564 is electrically connected to the common pulling-out electrode 562 at the bump portion 564A. Further, the edge portion of the common connection electrode 564 forms a common electrode pad 564P on the electric wiring face 524.

In addition, as described above, in an example of this embodiment, there is provided a configuration in which the gap dimension of the gap between the electrodes is larger than the reflecting-film to reflecting-film gap dimension G1, but the invention is not limited to this configuration. For example, in a case where infrared rays or far-infrared rays are used as measurement-target light rays, or the like, the configuration may be made such that the reflecting-film to reflecting-film gap dimension G1 is larger than the gap dimension of the gap between the electrodes.

The holding portion 522 is a diaphragm that surrounds the circumference of the movable portion 521 and that is formed such that the dimension of the thickness thereof is smaller than that of the thickness of the removable portion 521. The holding portion 522 having such a structure bends more easily than the movable portion 521, and thus, it is possible to displace the movable portion 521 to the side of the fixed substrate 51 by a slight electrostatic attractive force. In this case, since the dimension of the thickness of the movable portion 521 is larger than that of the thickness of the holding portion 522 and thereby the rigidity of the movable portion 521 is larger than that of the holding portion 522, any shape change does not occur in the movable portion 521 even when the holding portion 522 is pulled to the side of the fixed substrate 51 by the electrostatic attractive force. Thus, any bending does not occur in the movable reflecting film 55 provided in the movable portion 521, thereby enabling the fixed reflecting film 54 and the movable reflecting film 55 to be constantly kept in a mutually parallel state.

In addition, in this embodiment, there is provided an example in which the holding portion 522 has a diaphragm structure, but the invention is not limited this configuration, and the configuration may be made such that a holding portion having a beam structure, in which beams are arranged at intervals of an equal angle around a virtual central axis perpendicularly passing through the filter center point O, is provided.

As described above, the substrate outer circumference portion 525 is provided at the outer side of the holding portion 522 in the filter plan view. The substrate outer circumference portion 525 includes, on its face facing the fixed substrate 51, the second bonding portion 523 that faces the first bonding portion 513 of the fixed substrate 51 and that is bonded to the first bonding portion 513 via the bond film 53.

Configuration of Voltage Control Unit

The voltage control unit 15 corresponds to a driving control means included in an actuator apparatus according to the invention, and includes, as shown in FIG. 2, the DAC 151, the capacitance detector 152, the controller 153, and a microcomputer 16.

Further, the voltage control unit 15 includes a ground circuit 154 electrically connected to the common electrode pad 564P, and the common electrode 561 is set to a common electric potential (for example, zero electric potential) via the common electrode pad 564P electrically connected to the ground circuit 154.

The DAC 151 converts a voltage designation signal having been input from the microcomputer 16 into an analog voltage, and outputs the analog voltage. Specifically, as shown in FIG. 2, the DAC 151 includes the four bias channels (Ch. 1, Ch. 2, Ch. 3, and Ch. 4), each outputting a voltage to be supplied to a corresponding one of the four bias actuators 57, and the target value channel (Ch. 5) that outputs a target value having been input from the microcomputer 16.

The capacitance detector 152 is connected to the reflecting films 54 and 55, and detects a gap dimension of the reflecting-film-to-reflecting-film gap G1 on the basis of electrostatic capacitance between the reflecting films 54 and 55. That is, the capacitance detector 152 and the reflecting films 54 and 55 correspond to a gap detection portion included in an actuator apparatus according to the invention.

Specifically, the capacitance detector 152 includes a C-V conversion circuit (omitted from illustration), and converts the electrostatic capacitance between the reflecting films 54 and 55 into a voltage signal (a detection signal). Examples of the C-V conversion circuit include a switched capacitor circuit.

Further, the capacitance detector 152 outputs the detection signal to the controller 153 and the microcomputer 16.

In addition, the capacitance detector 152 may output an analog signal or may output digital signal, as the detection signal. In the case where a digital signal is output, the detection signal (analog signal) from the C-V conversion circuit is input to an analog-to-digital (A/D) convertor and thereby is converted into a digital value.

The controller 153 is electrically connected to the target value channel of the DAC 151 and the control electrode pad 58P. The controller 153 supplies a feedback voltage to the control actuator 58 on the basis of the detection signal input from the capacitance detector 152 and a target instruction signal that is input from the DAC 151 and that instructs setting of a given target value corresponding to a target gap dimension of the gap G1.

Specifically, the controller 153 performs control so as to make a deviation of the value of the detection signal relative to the given target value designated by the target instruction signal smaller than or equal to a predetermined threshold value by increasing/decreasing a driving voltage for the control actuator 58. That is, the controller 153 performs feedback control on the basis of the target instruction signal and the detection signal.

The microcomputer 16 includes a storage means (not illustrated), such as a memory device. Various pieces of data and various programs that are for use in controlling, for example, the wavelength variable interference filter 5 are recorded in the storage means. Examples of the various pieces of data include pieces of relation data indicating relations between gap dimensions of the reflecting-film-to-reflecting-film gap G1 and target wavelengths.

Further, as shown in FIG. 2, the microcomputer 16 functions as an initial driving means 161, a parameter calculating means 162, a drive instructing means 163, and the like.

The initial driving means 161 controls initial driving operation for calculating driving parameters for each of the bias actuators 57. Specifically, the initial driving means 161 performs control such that a preset predetermined initial driving voltage is sequentially supplied to each of the bias actuators 57.

The parameter calculating means 162 calculates, for each of the bias actuators 57, the driving parameters on the basis of initial driving voltages and gap dimensions based on detection signals having been input from the capacitance detector 152 during the initial driving operation. Specifically, the parameter calculating means 162 calculates a distribution of spring constants of the movable substrate 52 included in the wavelength variable interference filter 5, and an initial gap dimension of the gap (i.e., electrode-to-electrode gap) between the common electrode 561 and one of the bias electrodes 571, which constitute each of the bias actuators 57.

Further, the parameter calculating means 162 calculates bias voltages each of which is supplied to a corresponding one of the bias actuators 57 when the spectroscopic measurement is carried out, on the basis of the spring contacts and the initial gap dimensions, having been calculated above. The spring contact, the initial gap dimension, and the bias voltage correspond to at least one driving parameter derived by a driving control means included in an actuator apparatus according to the invention.

The drive instructing means 163 controls the electrostatic actuator portion 56 on the basis of a wavelength instruction having been input from the control unit 20. The wavelength instruction is an instruction that causes light rays of a target wavelength to be transmitted by the wavelength variable interference filter 5, and that includes the target wavelength. The drive instructing means 163 acquires a gap dimension value (a target value) which corresponds to the target wavelength, and to which the dimension of the gap G1 is to be set, by referring to, for example, the pieces of relation data stored in the storage means.

Further, the drive instructing means 163 supplies each of the bias voltages having been calculated by the parameter calculating means 162 to a corresponding one of the bias actuators 57.

In addition, further detailed description of the individual function components of the microcomputer 16 will be made below.

Configuration of Control Unit

Returning to FIG. 1, the control unit 20 of the spectroscopic measurement apparatus 1 will be described below.

The control unit 20, which corresponds to a processing control unit included in an electronic device according to the invention, is realized by combining, for example, a CPU, a memory device, and the like, and controls the entire operation of the spectroscopic measurement apparatus 1. As shown in FIG. 1, the control unit 20 includes a parameter setting unit 21, a wavelength setting unit 22, a light amount acquisition unit 23, a spectroscopic measurement unit 24, and a storage unit 30. Various pieces of data, various programs, and the like, which are for use in controlling the entire operation of the spectroscopic measurement apparatus 1, are recorded in the storage unit 30.

The parameter setting unit 21 performs initialization processing at the time when the spectroscopic measurement apparatus 1 performs spectroscopic measurement processing. Specifically, the parameter setting unit 21 calculates the spring constants of the movable substrate 52 included in the wavelength variable interference filter 5, and the initial gap dimensions of the reflecting-film-to-reflecting-film gap G1, and the like.

The wavelength setting unit 22 sets a target wavelength of light rays to be transmitted by the wavelength variable interference filter 5, and outputs, to the voltage control unit 15a, a wavelength instruction for instructing the voltage control unit 15 to cause the wavelength variable interference filter 5 to transmit light rays of the target wavelength having been set.

The light amount acquisition unit 23 acquires a light amount of light rays that have been transmitted by the wavelength variable interference filter 5 and that has the target wavelength, on the basis of a detection signal that is output by the detector 11 and that corresponds to a light amount of light rays having been detected by the detector 11.

The spectroscopic measurement unit 24 measures the spectral characteristic of measurement-target light rays on the basis of light amounts having been acquired by the light amount acquisition unit 23.

Driving Method for Wavelength Variable Interference Filter

Next, a driving control method for the optical module 10 in this embodiment (a control method for an actuator apparatus, according invention) will be described on the basis of some of the accompanying drawings.

Parameter Setting Processing

Figure 6:
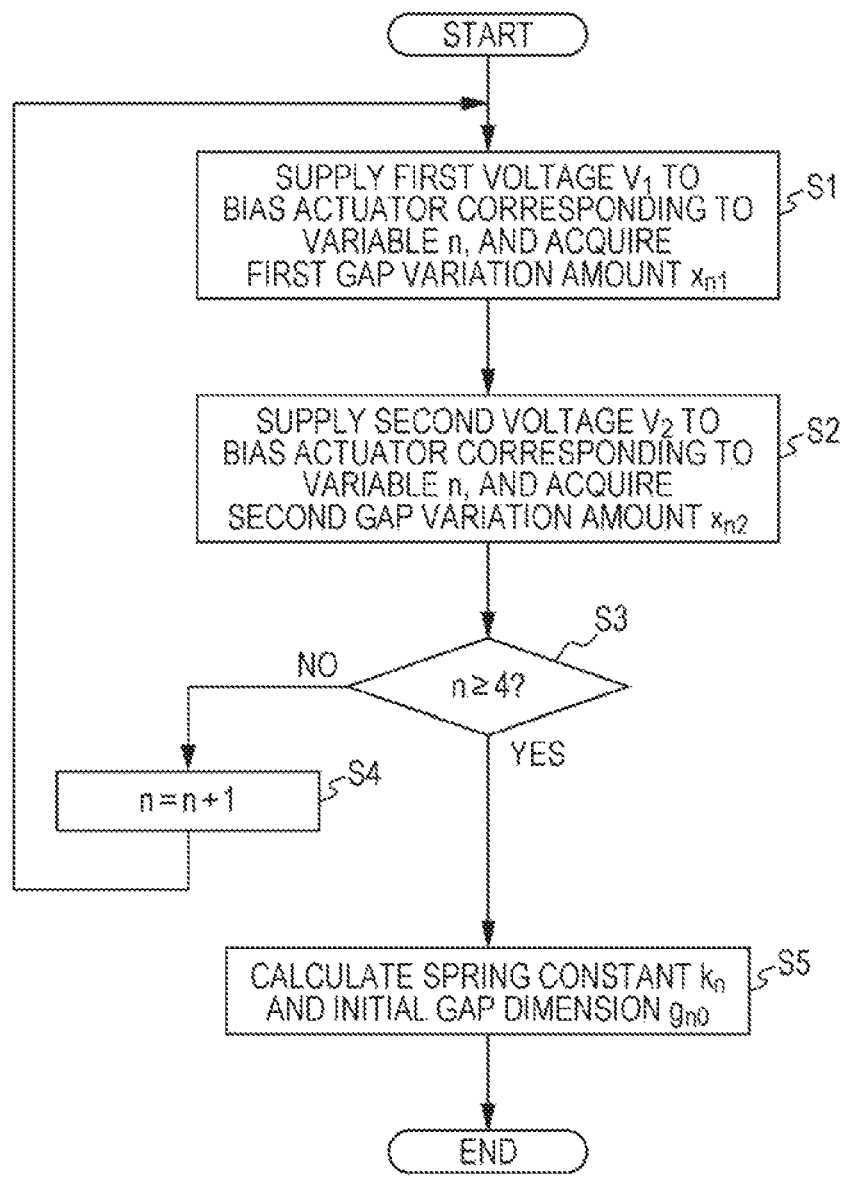
FIG. 6 is a flowchart illustrating parameter setting processing in an optical module according to a first embodiment of the invention.

FIG. 6 is a flowchart illustrating parameter setting processing in a driving control method (control processing) for the optical module 10.

When the spectroscopic measurement apparatus 1 performs spectroscopic measurement processing, first, the parameter setting unit 21 of the control unit 20 outputs a parameter setting instruction to the optical module 10. Upon reception of this parameter setting instruction, the optical module 10 performs parameter setting processing for calculating the spring constants and the initial gap dimensions that are driving parameters for use in calculating the bias voltages. In addition, this parameter setting processing may be performed only when, for example, first spectroscopic measurement processing is performed by the spectroscopic measurement apparatus 1, or may be performed periodically.

In the following description, each of the bias actuators 57 is identified by a corresponding variable n. An initial value of the variable n is made "1"; n=1 indicates the bias actuator 57A; n=2 indicates the bias actuator 57B; n=3 indicates the bias actuator 57C; and n=4 indicates the bias actuator 57D.

In the parameter setting processing, first, the initial driving means 161 supplies a preset first voltage $V_1$ to one of the bias actuators 57 that corresponds to a variable n, and then acquires a variation amount of the dimension of the gap G1 (i.e., a first gap variation amount $x_{n1}$) (step S1).

For example, in the case where n=1, the initial driving means 161 sets an electric potential to be supplied to the bias electrode 571A from the bias channel (Ch. 1) of the DAC 151 to the first voltage $V_1$, and then supplies the first voltage $V_1$ to the bias electrode 57A. Through this operation, the bias actuator 57A is driven and as a result, the gap dimension of the gap G1 varies, thereby also causing the variation of the detection signal output from the capacitance detector 152. The initial driving means 161 acquires a first gap dimension $x_{11}$ as a variation amount of the dimension of the gap G1 on the basis of the input detection signal.

Next, the initial driving means 161 supplies a second voltage $V_2$ different from the first voltage $V_1$ to the one of the bias actuators 57 that corresponds to the variable n, and then acquires a variation amount of the dimension of the gap G1 (i.e., a second gap variation amount $x_{n2}$) (step S2).

In addition, the first gap variation amounts $x_{n1}$ and the second gap variation amount $x_{n2}$ having been acquired in step S1 and step S2, respectively, are stored in the storage means.

Next, the initial driving means 161 determines whether or not the variable n satisfies n≥4 (step S3). In the case where the result of the determination in step S3 is "No", the variable n is incremented by "1" (step S4), and then, the process flow returns to step S1.

In the case where the result of the determination in step S3 is "Yes", that is, when the initial driving means 161 has completed the processing for sequentially driving each of the bias actuators 57 and thereby supplying the first voltage $V_1$ and the second voltage $V_2$ thereto to acquire the first gap variation amount $x_{n1}$ and the second gap variation amount $x_{n2}$, respectively, the parameter calculating means 162 calculates, for each of the bias actuators 57, an initial gap dimension $g_{n0}$ of the electrode-to-electrode gap and a spring constant $k_n$ of the movable substrate 52 (step S5).

Hereinafter, a calculation method that is performed by the parameter calculating means 162 and that is for use in calculating the initial gap dimension $g_{n0}$ of the electrode-to-electrode gap for one of the bias actuators 57 that corresponds to the variable n, as well as the spring constant $K_n$ of an area in which the one of the bias actuators 57 is provided, will be described.

Here, an area of the bias actuator 57 (i.e., an area of the bias electrode 571) is made Sb (in this embodiment, it is assumed that the bias electrodes 571 has the same area), and a dielectric constant between the bias electrode 571 and the common electrode 561 is made ε. Further, since, in the wavelength variable filter 5, a difference between the gap variation amount of the dimension of the reflecting-film-to-reflecting-film gap G1 and the gap variation amount of the dimension of the electrode-to-electrode gap is significantly small, the gap variation amount of the dimension of the electrode-to-electrode gap can be approximated by the gap variation amount of the dimension of the reflecting-film-to-reflecting-film gap G1.

A gap dimension $g_{n1}$ at the time when the first voltage $V_1$ is supplied to the bias actuator 57 can be presented by $g_{n1}=g_{n0}-x_{n1}$. Similarly, a gap dimension $g_{n2}$ at the time when the second voltage $V_2$ is supplied to the bias actuator 57 can be presented by $g_{n2}=g_{n0}-x_{n2}$. Further, with respect to the movable substrate 52, since a spring force due to the rigidity of the movable substrate 52 equals an electrostatic attractive force, the following formulas (1) and (2) are derived:

$$k_n x_{n1} = \frac{\varepsilon S_b V_1^2}{2 g_{n1}^2} \quad (1)$$

$$k_n x_{n2} = \frac{\varepsilon S_b V_2^2}{2 g_{n2}^2} \quad (2)$$

When the above formula (1) is transformed, the following formula (3) can be obtained:

$$k_n = \frac{\varepsilon S_b V_1^2}{2 x_{n1} g_{n1}^2} \quad (3)$$

Moreover, when the above formula (3) is substituted into the above formula (2), the following formula (4) can be obtained.

$$\frac{g_{n2}}{g_{n1}} = \frac{V_2}{V_1} \sqrt{\frac{x_{n1}}{x_{n2}}} = A \quad (4)$$

Since, in the formula (4), the following relation: $A=g_{n2}/g_{n1}=(g_{n0}-x_{n2})/(g_{n0}-x_{n1})$ is satisfied, the initial gap dimension $g_{n0}$ of the bias electrode 571 can be calculated by using the following formula (5).

$$g_0 = \frac{x_{n2} - A x_{n1}}{1 - A} \quad (5)$$

The parameter calculating means 162 first calculates, for each of the bias actuators 57, the initial gap dimension $g_{n0}$ of the electrode-to-electrode gap on the basis of the formulas (4) and (5). Further, the parameter calculating means 162 calculates the spring constant $k_n$ by substituting the calculated initial gap dimension $g_{n0}$ into the formula (3).

Through the processes described above, for each of the actuators 57, which is associated with a corresponding one of the variables n (=1, 2, 3, and 4), the initial gap dimension $g_{n0}$ of the electrode-to-electrode gap, and the spring constant $k_n$ of an area in which the relevant actuator 57 is provided (that is, an element for obtaining a distribution of the spring constants with respect to the movable substrate 52) are calculated. Further, the state of inclination and an inclination amount with respect to the movable portion 521 can be detected on the basis of the distribution of the initial gap dimensions $g_{no}$, and further, the rigidity distribution of the holding portion 522 functioning as a diaphragm can be detected on the basis of the distribution of the spring constants kn.

Driving Control Processing

Next, driving control processing for outputting light rays of a desired wavelength from the optical module 10 by using the above-described driving parameters, that is, the spring constants $k_n$ and the initial gap dimensions $g_{n0}$, will be described on the basis of some of the accompanying drawings.

In order to acquire the density of light rays of each wavelength, included in measurement-target light rays, first, the control unit 20 causes the wavelength setting unit 22 to set a wavelength of light rays to be transmitted by the wavelength variable interference filter 5 (i.e., a target wavelength). Further, the wavelength setting unit 22 outputs a wavelength instruction for instructing the transmission of light rays of a desired wavelength having been set above, to the voltage control unit 15.

Upon input of the wavelength instruction from the control unit 20, the parameter calculating means 162 of the microcomputer 16 acquires a gap dimension (a target gap dimension value) of the reflecting-film-to-reflecting-film gap G1, this gap dimension being required for the light rays of a target wavelength to be transmitted by the wavelength variable interference filter 5. Specifically, a set of "wavelengths–target gap value" data, in which correspondence relations between wavelengths and target gap dimension values are recorded, is stored in advance in the storage means, and the parameter calculating means 162 acquires a target gap dimension value corresponding to the target wavelength on the basis of the above set of "wavelength–target gap dimension value" data.

Subsequently, the parameter calculating means 162 calculates the bias voltages $V_{bn}$ each to be supplied to a corresponding one of the bias actuators 57 on the basis of the acquired target gap value.

In this case, the microcomputer 16 sets the individual bias voltages $V_{bn}$ such that, in the feedback control performed by the controller 153, a sensitivity level at the time when a voltage is supplied to the control actuator 58 (i.e., a gap variation amount relative to a supplied voltage (m/V)) becomes constant, and further, the reflecting films 54 and 55 are kept in a mutually parallel state.

Specifically, the parameter calculating means 162 calculates the individual bias voltages $V_{bn}$ (i.e., $V_{b1}$, $V_{b2}$, $V_{b3}$, and $V_{b4}$) on the basis of the following formula (6).

$$V_{bn} = \sqrt{\frac{k_n}{\varepsilon S_b}\left\{2x(g_{n0}-x)^2 - \frac{k_n R_c(g_{n0}-x)^2(g_{n0}-3x)^2}{\varepsilon S_c}\right\}} \quad (6)$$

In the formula (6), Sc denotes an effective area of the control actuator 58, and x denotes a displacement amount by which, in order to make the dimension of the reflecting-film-to-reflecting-film gap G1 equal to the target gap dimension value, the movable portion 521 is required to be displaced. Further, Rc denotes a sensitivity level of the control actuator 58, and this sensitivity level Rc is set to a predetermined constant value in this embodiment.

Subsequently, the drive instructing means 163 outputs, to the DAC 151, a voltage instruction signal for instructing setting of the individual bias voltages $V_{bn}$, which have been calculated on the basis the target gap value in step S12. Upon input of the voltage instruction signal, the DAC 151 supplies each of the bias voltages $V_{bn}$ to a corresponding one of the actuators 57 through a corresponding one of the bias channels (Ch. n).

This operation causes electrostatic attractive forces to be applied to the bias actuators 57, and thereby causing the movable portion 521 to move to the side of the fixed substrate 51 so that the movable portion 521 comes into a state of being parallel to the fixed substrate 51.

Thereafter, the feedback control is performed by the controller 153.

That is, the controller 153 calculates a deviation between a detected signal input from the capacitance detector 152 and a target instruction signal input from the target value channel (Ch. 5), and supplies the control actuator 58 with a feedback voltage so as to make the deviation equal to "0".

Through the driving control processing described above, light rays of a target wavelength are output from the wavelength variable interference filter 5 and are received by the detector 11. Further, the light amount acquisition unit 23 of the control unit 20 acquires the light amount of the light rays of a target wavelength on the basis of an input signal from the detector 11.

Further, the acquisition of light amounts of light rays having a plurality of wavelengths, this acquisition being required in the spectroscopic measurement, can be achieved by repeatedly performing the above-described driving control processing in conjunction with sequential switching of a target wavelength corresponding to each of the plurality of wavelengths. In this way, it becomes possible for the spectroscopic measurement unit 24 to carry out spectroscopic measurement processing on a measurement target on the basis of the acquired light amounts each associated with light rays of a corresponding one of the target wavelengths.

Operational Effects of this Embodiment

In the optical module 10 of the spectroscopic measurement apparatus 1 according to this embodiment, the four bias actuators 57 are provided in the wavelength variable interference filter 5 such that the individual bias actuators 57 are located asymmetric relative to the driving central axis, and the initial driving means 161 of the microcomputer 16 sequentially drives these bias actuators 57. When a constant voltage is supplied to one of the bias actuators 57, the electrostatic attractive force applied to electrodes constituting the relative bias actuator 57 varies depending on the gap dimension of the gap between the electrodes, thereby also causing the variation of a detection signal detected by the capacitance detector 152. Thus, the parameter calculating means 162 can calculate an inclination state and an inclination amount with respect to the movable portion 521 of the movable substrate 52 to determine the inclination state of the movable portion 521 through the process of, for each of the bias actuators 57, sequentially supplying the first voltage $V_1$ and the second voltage $V_2$, and causing the capacitance detector 152 to detect respective resultant amounts of variations in the gap dimension of the electrode-to-electrode gap. Accordingly, the parameter calculating means 162 can easily calculate bias voltages for keeping the movable portion 521 in the state of being parallel to the fixed substrate 51, on the basis of the inclination state.

Further, in the aforementioned configuration, it is unnecessary to detect electrode-to-electrode gaps each associated with a corresponding one of the four bias actuators in order to calculate the bias voltages, and it is sufficient just to detect the gap dimension of the reflecting-film-to-reflecting-film gap G1 with respect to the reflecting films 54 and 55. That is, it is unnecessary to provide a plurality of capacitance detectors, and thus, it is possible to realize the simplification of the configuration of the optical module 10 as well as that of the spectroscopic measurement apparatus 1.

In the spectroscopic apparatus 1 according to this embodiment, the parameter calculating means 162 calculates, as the driving parameters, the bias voltages for keeping the moving portion 521 and the fixed substrate 51 in a mutually parallel state.

This method of keeping the moving portion 521 and the fixed substrate 51 in a mutually parallel state leads to keeping the reflecting films 54 and 55 in a mutually parallel state, thereby making it possible for the wavelength variable interference filter 5 to transmit light rays of each of desired target wavelengths.

Here, the parameter calculating means 162 calculates, for each variable n (=1, 2, 3, and 4), the initial gap dimension $g_{n0}$ of the electrode-to-electrode gap with respect to a corresponding one of the bias actuators 57, and the spring contact $K_n$ of an area of the movable substrate 52, in which the relevant bias actuator 57 is provided, on the basis of the above formulas (3) and (5).

The above calculation of the initial gap dimensions $g_{n0}$ and the spring contacts $K_n$ makes it possible to easily perform calculation using the above formula (6) with respect to the bias voltages $V_{bn}$ that correspond to a target gap dimension value and that keep the sensitivity level Rc of the control actuator 58 to a constant value. Further, the distribution of the initial gap dimensions $g_{n0}$ and the distribution of the spring constants $K_n$ make it possible to detect an inclination direction and an inclination amount with respect to the movable portion 521 of the movable substrate 52.

In the spectroscopic measurement apparatus 1, the wavelength variable interference filter 5 includes the control actuator 58. Further, when the parameter calculating means 162 calculates the bias voltages on the basis of the formula (6) and applies each of the calculated bias voltages to a corresponding one of the bias actuators 57, an electrostatic attractive force is applied to each of the bias actuators 57 so as to correct the inclination of the moving portion 521, thereby enabling keeping the reflecting films 54 and 55 in a mutually parallel state. Further, through a method of applying a feedback voltage to the control actuator 58 under such a situation, it is possible to highly accurately set the gap dimension of the reflecting-film-to-reflecting-film gap G1 to a desired target gap dimension value.

Further, such a feedback control process as described above is simpler, as compared with a case where voltages each to be supplied to a corresponding one of the bias actuators 57 are feedback controlled. That is, in the case where each of the bias actuators 57 is feedback controlled, an interaction caused by driving each of the bias actuators 57 is necessary to be taken into consideration, and thus, it becomes difficult to perform the feedback control. In contrast thereto, in this embodiment, only the control actuator 58 is feedback controlled, and thus, simple and high-accuracy feedback control can be realized.

In this embodiment, the capacitance detector 152 detects the dimension of the gap between the reflecting films 54 and 55 each located at a central portion surrounding the driving central axis. For this reason, the configuration can be simplified to a greater degree, as compared with a case where, for example, capacitance detection electrodes are provided at positions far from the reflecting films 54 and 55. Further, in the wavelength variable interference filter 5, since the gap dimension of the reflecting-film-to-reflecting-film gap G1 that is desired to be gap controlled with the highest accuracy is detected, it is easy to compare a detection value and a target value, and further, it is possible to increase the degree of accuracy in the feedback control.

Further, in this embodiment, the reflecting films 54 and 55 are each provided at a central portion surrounding the driving central axis. Thus, when each of calculated bias voltages has been supplied to a corresponding one of the bias actuators 57, as a result, the reflecting films 54 and 55 are each located at a position where the degree of parallelization is higher than that of any other position, and the parallelization of the reflecting films 54 can be kept further highly accurately.

Further, in the case where a position where the gap dimension is detected is located far from a certain one of the bias actuators 57, since a difference between the variation amount of the dimension of the electrode-to-electrode gap with respect to relevant bias actuator 57 and a variation amount of the gap dimension at the detection position becomes large, as a result, in the relevant bias actuator 57, the degree of accuracy of a bias voltage for keeping the movable portion 521 in the state of being parallel to the fixed substrate 51 is decreased.

In contrast thereto, in this embodiment, since the central axis is located at a position distanced from each of the bias actuators 57 by a constant distance and a difference between a gap variation amount of the dimension of the reflecting-film-to-reflecting-film gap G1 and a gap variation amount of the dimension of the electrode-to-electrode gap is slight, it is possible to calculate the bias voltages with high accuracy.

Other Embodiments

It is to be noted that the invention is not limited to the aforementioned embodiment, but any modification, improvement, or the like within a scope where the objective of the invention can be achieved is included in the invention.

The above embodiment has been described by way of an example in which the control actuator 58 is provided in the wavelength variable interference filter 5 and a feedback voltage is supplied to the control actuator 58 by the controller 153, but the invention is not limited to this configuration.

For example, the feedback control may not be performed, and the wavelength variable interference filter 5 may be driven by using only the bias actuators 57. In this case, the control actuator 58 and the controller 153 included in the wavelength variable interference filter 5 can be made unnecessary.

Further, in such a configuration, the parameter calculating means 162 supplies each of bias voltages calculated by using the following formula (7) to a corresponding one of the bias actuators 57.

$$V_{bn} = \sqrt{\frac{2k_n x(g_{n0} - x)^2}{\varepsilon S_b}} \quad (7)$$

The above embodiment has been described by way of an example in which, in the parameter setting processing, the four bias actuators 57 are sequentially driven one by one, but the invention is not limited to this process. The process may be performed such that, for example, every two bias actuators 57 that are located, in the filter plan view, adjacent to each other in a circumference direction along the same circumference of a circle whose center point is placed on the filter center point O are sequentially selected; each of voltages $V_1$ and $V_2$ is sequentially supplied to both of the selected two bias actuators 57 to drive them; and gap variation amounts $g_{nm1}$ and $g_{nm2}$ each associated with a corresponding one of the applied voltages $V_1$ and $V_2$ are acquired. For example, a pair of the bias actuators 57A and 57B, a pair of the bias actuators 57B and 57C, a pair of the bias actuators 57C and 57D, and a pair of the bias actuators 57D and 57A are each sequentially driven, and gap variation amounts $g_{121}$, $g_{122}$, $g_{231}$, $g_{232}$, $g_{341}$, $g_{342}$, $g_{411}$, and $g_{412}$ are acquired.

In addition, in this case, in each of the formulas (3), (6), and (7), $S_b$ is replaced by $2S_b$ that is an area of two bias actuators.

The above embodiment has been described by way of an example in which the four bias actuators 57 are disposed on the same circumference of a circle whose center point is placed on the filter center point O, but the invention is not limited to this configuration. For example, the bias actuators 57 may be constituted by two or three bias actuators, or may be constituted by five or more bias actuators. In the case where the number of the bias actuators 57 is small, the distribution of the spring constants as well as the distribution of the initial gap dimensions becomes rough and the degree of accuracy of the bias voltages for keeping the substrates 51 and 52 in a mutually parallel state is decreased, but the simplification of the configuration can be achieved. In the case where the number of the bias actuators 57 is large, the configuration becomes complicated, but the distribution of the spring constants as well as the distribution of the initial gap dimensions can be detected in more detail and, as a result, the degree of accuracy of each of the bias voltages is increased.

Further, the above embodiment has been described by way of an example in which the individual bias actuators 57 has the same shape and the same area, and are located at positions that are distanced from the driving central axis perpendicularly passing through the filter center point O by the same distance, but the invention is not limited to this configuration. For example, the individual bias actuators 57 may have mutually different shapes, and may have mutually different areas. In the case where the bias actuators 57 have mutually different areas, in each of the formulas (3), (6) and (7), a value each associated with a corresponding one of the areas is substituted into Sb.

Further, in the case where the individual bias actuators 57 are located at positions that are distanced from the driving central axis by mutually different distances, similarly, the bias voltages, which belong to a kind of driving parameters, can be calculated.

Further, the above embodiment has been described by way of an example in which a gap detection portion included in an actuator apparatus according to the invention is constituted by the reflecting films 54 and 55 and the capacitance detector 152, but the invention is not limited to this configuration. The above capacitance detection portion may be constituted by a capacitance detection electrode that is newly provided at a position, different from the positions of the reflecting films 54 and 55, between the substrates 51 and 52.

In this regard, however, as described above, a gap variation amount of the dimension of the electrode-to-electrode gap with respect to each of the bias actuators 57 is approximated by a gap variation amount at a gap dimension detection position where the dimension of a gap between the substrates 51 and 52 is detected, and thus, when the gap dimension detection position is largely far from the positions of the bias actuators 57, the degree of accuracy of the detection of the gap dimensions corresponding to the bias voltages is likely to be decreased. For this reason, the gap dimension detection position is preferable to be located at a position whose distance from each of the bias actuators is shorter than or equal to a predetermined threshold value.

Further, in the above embodiments, the spectroscopic measurement apparatus 1 has been described as an example of an electronic device according the invention, but an actuator apparatus, an electronic device, and a control method according to the invention can be embodied in other electronic devices for use in various fields.

Figure 7:
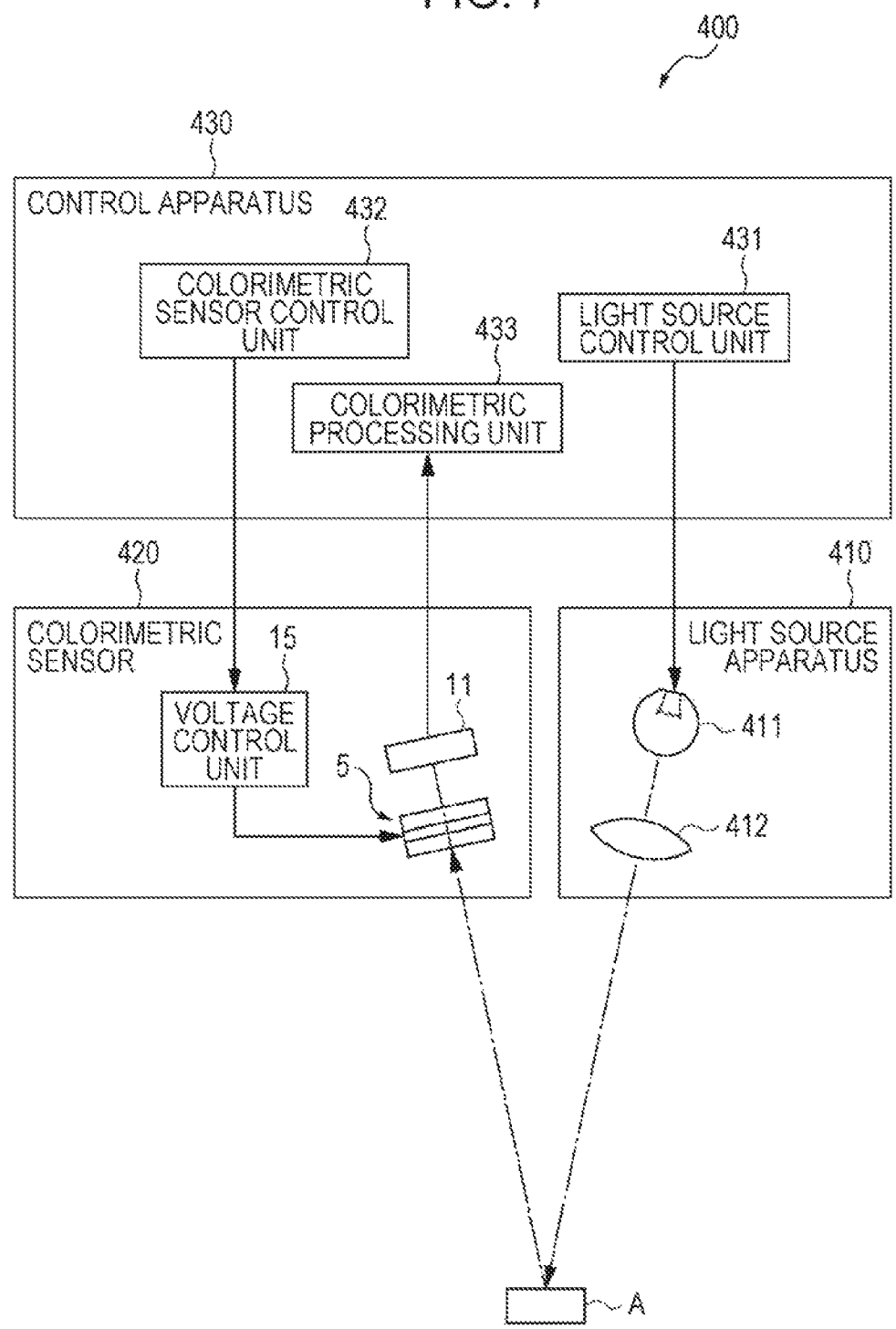
FIG. 7 is a schematic diagram illustrating a colorimetric apparatus that is an example of an electronic device according to the invention.

For example, as shown in FIG. 7, an electronic device according to the invention can be embodied as a colorimetric apparatus.

FIG. 7 is a block diagram illustrating an example of a colorimetric apparatus 400 including a wavelength variable interference filter.

As shown in FIG. 7, the colorimetric apparatus 44 includes a light source apparatus 410 that emits light rays toward an inspection target A, a colorimetric sensor 420 (an actuator apparatus), and a control apparatus 430 (a processing control unit) that controls the entire operation of the colorimetric apparatus 400. Further, the colorimetric apparatus 400 is an apparatus that causes the light rays emitted from the light source apparatus 410 to be reflected at the inspection object A; causes light rays having been reflected at the inspection object A to be input to the colorimetric sensor 420 as inspection-target light rays; causes the colorimetric sensor 420 to receive the inspection-target light rays; and analyzes and measures the chromaticity of the inspection target light rays, that is, the color of the inspection object A.

The light source apparatus 410 includes a light source 411 and a plurality of lenses (a single lens is illustrated in FIG. 7), and emits, for example, reference light rays (such as white light rays) toward the inspection object A. Further, the plurality of lenses 412 may include a collimator lens. When the collimator lens is included in the plurality of lenses 412, the light source apparatus 410 causes the reference light rays emitted from the light source 411 to pass through the collimator lens to thereby produce parallel reference light rays, and emits the produced parallel reference light rays toward the inspection object A. In addition, in this embodiment, there is provided an example in which the colorimetric apparatus 400 includes the light source apparatus 400, but when the inspection object A is a light emitting member, such as a liquid crystal display, the colorimetric apparatus 400 may be configured not to include the light source apparatus 410.

As shown in FIG. 7, the colorimetric sensor 420 includes a wavelength variable interference filter 5, a detector 11 that receives light rays having been transmitted by the wavelength variable interference filter 5, and a voltage control unit 15 that varies the wavelength of light rays to be transmitted by the wavelength variable interference filter 5. Further, the colorimetric sensor 420 is provided with an incident optical lens (not illustrated) that is located at a position facing the wavelength variable interference filter 5 and that guides the reflection light rays (inspection-target light rays) having been reflected at the inspection object A into the inside of the colorimetric sensor 420. Further, the colorimetric sensor 420 causes the wavelength variable interference filter 5 to transmit light rays of a given wavelength among the inspection-target light rays having been input from the incident optical lens, and causes the detector 11 to receive the transmitted light rays.

The control apparatus 430 controls the entire operation of the colorimetric apparatus 400.

The control apparatus 430 can be realized by employing any one of, for example, a general-purpose personal computer, a portable information terminal, and besides a colorimetry dedicated computer. Further, as shown in FIG. 7, the control apparatus 430 includes a light source control unit 431, a colorimetric sensor control unit 432, a colorimetric processing unit 433, and the like.

The light source control unit 431, which is communicably connected to the light source apparatus 410, outputs a predetermined control signal to the light source apparatus 410 to cause the light source apparatus 410 to emit white light rays having a predetermined degree of luminance, on the basis of, for example, a setting input by a user.

The colorimetric sensor control unit 432, which is communicably connected to the colorimetric sensor 420, outputs a control signal to the colorimetric sensor 420 and instructs the colorimetric sensor 420 to set a wavelength of light rays to be received and detect a light reception amount of received light rays of the relevant wavelength. Upon reception of the control signal, the colorimetric sensor 420 causes the voltage control unit 15 to supply voltages to an electrostatic actuator portion 56 to drive the wavelength variable interference filter 5.

The colorimetric processing unit 433 analyzes the chromaticity of the inspection object A on the basis of the light reception amounts having been detected by the detector 11.

Further, a light-based system can be provided as another embodiment of an electronic device according to the invention. Examples of such a light-based system include various kinds of gas detection apparatuses, such as an in-vehicle gas leak detector that highly sensitively detects a specific gas by employing a spectroscopic measurement method using the wavelength variable interference filter having been described in the above embodiment, and a photo-acoustic noble gas detector for an expired-air inspection.

Hereinafter, an example of such gas detection apparatuses will be described on the basis of some of the accompanying drawings.

Figure 8:
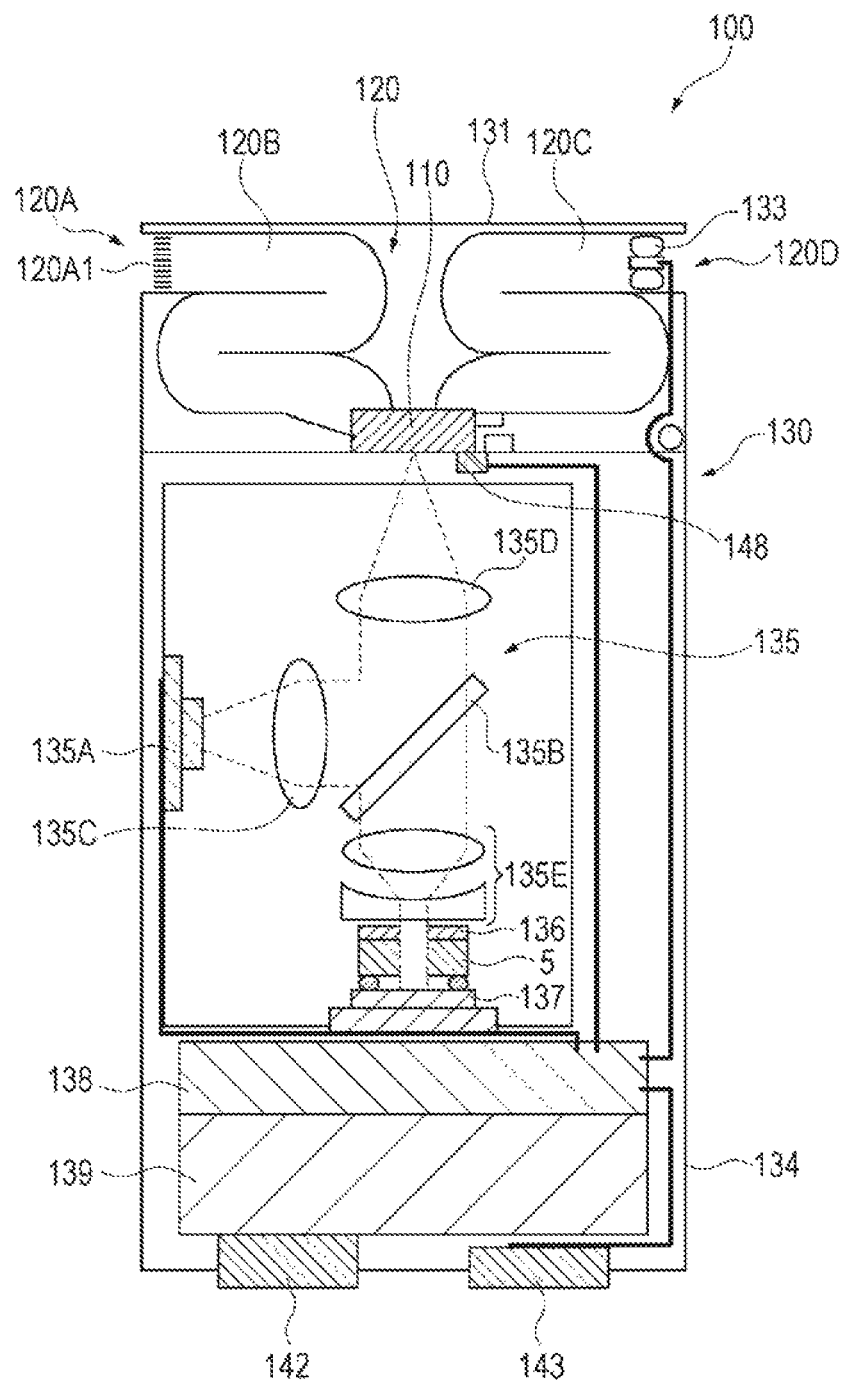
FIG. 8 is a schematic diagram illustrating a gas detection apparatus that is an example of an electronic device according to the invention.

FIG. 8 is a schematic diagram illustrating an example of a gas detection apparatus including a wavelength variable interference filter.

Figure 9:
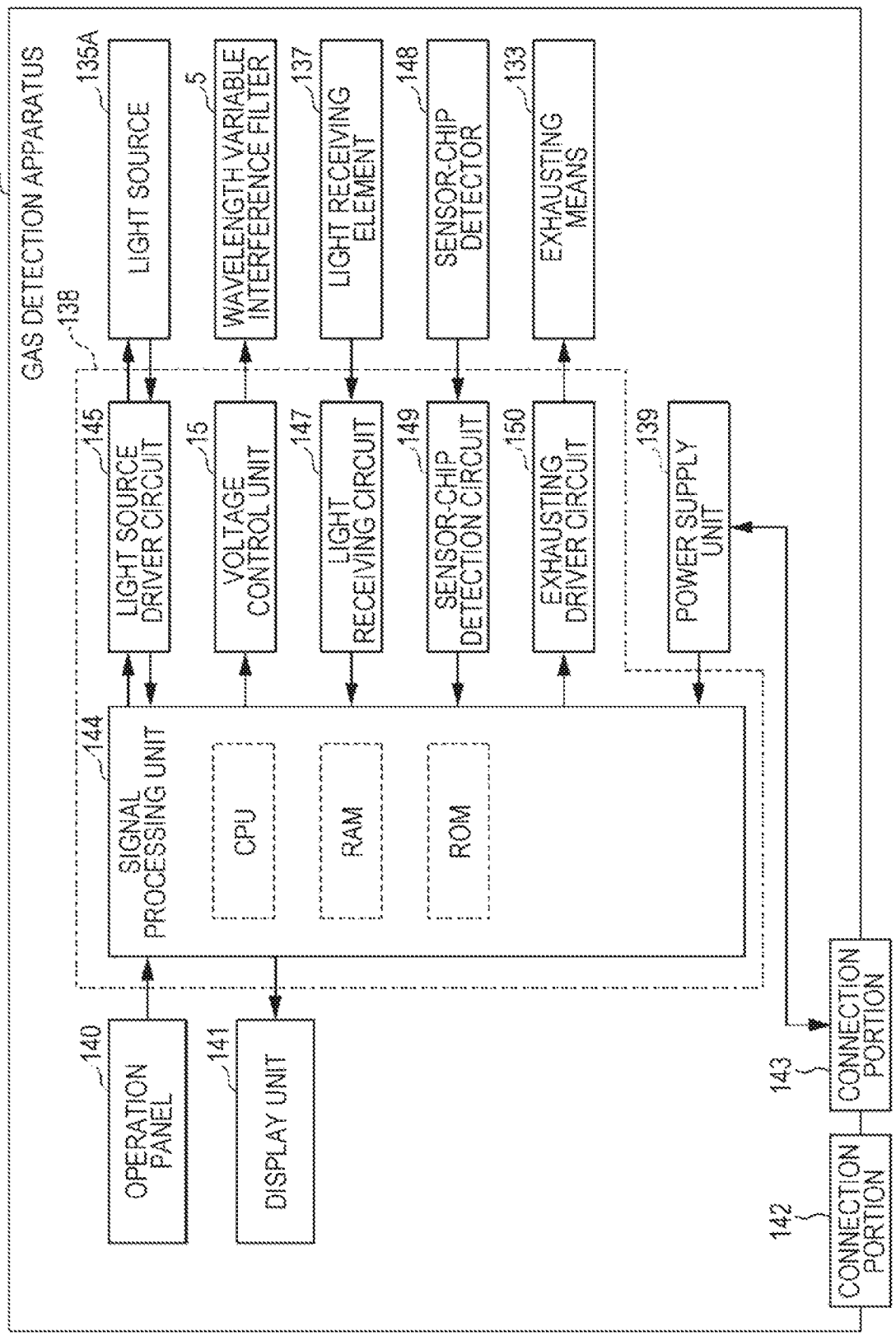
FIG. 9 is a block diagram illustrating a configuration of a control system of the electronic device illustrated in FIG. 8.

FIG. 9 is a block diagram illustrating a configuration of a control system for the gas detection apparatus shown in FIG. 8.

As shown in FIG. 8, a gas detection apparatus 100 includes a body portion 130, and a flow path 120 provided with a sensor chip 110, a suction port 120A, a suction flow path 120B, an exhaust flow path 120C, and an exhaust port 120D.

The body portion 130 is constituted by a detection apparatus (an actuator apparatus) including a sensor-portion cover 131 provided with an opening through which the flow path 120 can be attached/detached, an exhausting means 133, a housing 134, an optical portion 135, a filter 136, a wavelength variable interference filter 5, a light receiving element 137 (a detection portion), and the like; a control unit 138 (a processing control unit) that processes a detection signal and controls the light receiving element 137; a power supply unit 139 that supplies electric power; and the like. Further, the optical portion 135 is constituted by a light source 135A that emits light rays; a beam splitter 135B that reflects light rays having been input from the light source 135A to the side of the sensor chip 110 and that transmits light rays having been input from the side of the sensor chip 110 to the side of the light receiving element 137; and lenses 135C, 135D, and 135E.

Further, as shown in FIG. 9, an operation panel 140; a display unit 141, a connection portion 142 that interfaces with external devices, and the power supply unit 139 are provided on the surface of the gas detection apparatus 100. When the power supply unit 139 is a second battery, a connection portion 143 for charging may be provided.

Moreover, as shown in FIG. 9, the control unit 138 of the gas detection apparatus 100 includes a signal processing unit 144 constituted of a CPU and the like, a light source driver circuit 145 that controls the light source 135A, a voltage control unit 15 that controls the wave length variable interference filter 5, a light receiving circuit 147 that receives a signal from the light receiving element 137; a sensor-chip detection circuit 149 that receives a signal from a sensor-chip detector 148 that reads out a code of the sensor chip 110 and thereby detects the presence or absence of the sensor chip 110; an exhausting driver circuit 150 that controls the exhausting means 133; and the like.

Next, the operation of the gas detection apparatus 100 described above will be described below.

The sensor-chip detector 148, which is provided in the inside of the sensor cover 131 attached to the upper portion of the body portion 130, detects the presence or absence of the sensor chip 110. Upon detection of a detection signal from the sensor-chip detector 148, the signal processing unit 144 determines that the sensor chip 110 is in an attached state, and outputs a display signal for notifying that detection is operational, to the display unit 141.

Further, for example, when having received an input operation by a user, the operation panel 140 outputs an instruction signal for instructing the start of detection processing to the signal processing unit 144, which, first, outputs a light-source actuation signal to the light source driver circuit 145 to cause the light source driver circuit 145 to drive the light source 135A. When the light source 135A has been driven, a stable linearly-polarized laser light beam of a single wavelength is emitted from the light source 135A. Further, the light source 135A incorporates a temperature sensor and a light amount sensor, and pieces of temperature information as well as pieces of light amount information are output to the signal processing unit 144. Further, when having determined that the light source 135A is in a stable operation state, on the basis of the pieces of temperature information input from the light source 135A as well as the pieces of light amount information input from the light source 135A, the signal processing unit 144 controls the exhausting driver circuit 150 so as to cause the exhausting driver circuit 150 to actuate the exhausting means 133. As a result, a sample gas, which is supposed to contain a detection-target substance (gas molecules), is guided from the suction port 120A to the suction flow path 120B, the inside of the sensor chip 110, the exhaust flow path 120C, and the exhaust port 120D. In addition, the suction port 120A is provided with a dustproof filter 120A1, and thereby, relatively large dust particles, part of water vapor, and the like are eliminated.

Further, the sensor chip 110 is a sensor that incorporates a plurality of metallic nanostructures and that utilizes localized surface plasmon resonance. In the sensor chip 110, intensified electric fields are formed among the metallic nanostructures by the laser light beam, and when the gas molecules enter the intensified electric fields, Raman scattering light rays including information related to a molecule oscillation and Rayleigh scattering light rays arise.

These Rayleigh scattering light rays and Raman scattering light rays enter the filter 136 via the optical portion 135. The Rayleigh scattering light rays are isolated and eliminated by the filter 136, and only the Raman scattering light rays enter the wavelength variable interference filter 5. Further, the signal processing unit 144 outputs a control signal (a wavelength instruction) to the voltage control unit 15. Upon reception of the control signal, the voltage control unit 15 drives the wavelength variable interference filter 5 in the same driving method as described in the above embodiment so as to cause the wavelength variable interference filter 5 to transmit Raman scattering light rays corresponding to the detection-target gas molecules. Subsequently, upon reception of the Raman scattering light rays having been transmitted by the wavelength variable interference filter 5, the light receiving element 137 outputs a light reception signal in accordance with a light amount of the received Raman scattering light rays, to the signal processing unit 144 via the light receiving circuit 147. In this case, it is possible to extract target Raman scattering light rays with high accuracy by using the wavelength variable interference filter 5.

The signal processing unit 144 compares a set of spectral data relating to the Raman scattering light rays corresponding to the detection-target gas molecules, and having been obtained by repeatedly performing such a process as described above, with sets of spectral data stored in a ROM device to identify substances contained in the sample gas, and thereby determines whether or not the detection-target gas molecules are contained in the sample gas. Thereafter, the signal processing unit 144 displays information relating to the result of the determination on the display unit 141, and outputs the information relating thereto to external devices through the connection portion 142.

In addition, the gas detection apparatus has been described by way of an example in which the gas detection apparatus 100, shown in FIGS. 8 and 9, performs gas detection from Raman scattering light rays dispersed by the wavelength variable interference filter 5, but a gas detection apparatus that identifies kinds of gases contained in a sample gas by detecting absorbance specific to each of the kinds of gases may be provided as an example of the gas detection apparatus. In this case, an actuator apparatus according to the invention is embodied as a gas sensor that detects light rays that are among incident light rays and that are absorbed by a gas flown into the inside of the gas sensor. Further, a gas detection apparatus that incorporates such a gas sensor that analyzes and discriminates the gas having been flown into the inside of the gas sensor becomes an embodiment of an electronic device according to the invention. Such a configuration also makes it possible to detect gas components by employing the wavelength variable interference filter.

Further, examples of a system that detects the presence of a specific substance include, not only the above-described gas detection apparatuses, but substance component analysis apparatuses, such as a noninvasive measurement apparatus for saccharide using near-infrared spectroscopy and a noninvasive measurement apparatus for information related to food, living matter, minerals, or the like.

Hereinafter, a food analysis apparatus will be described as an example of the substance component analysis apparatuses.

Figure 10:
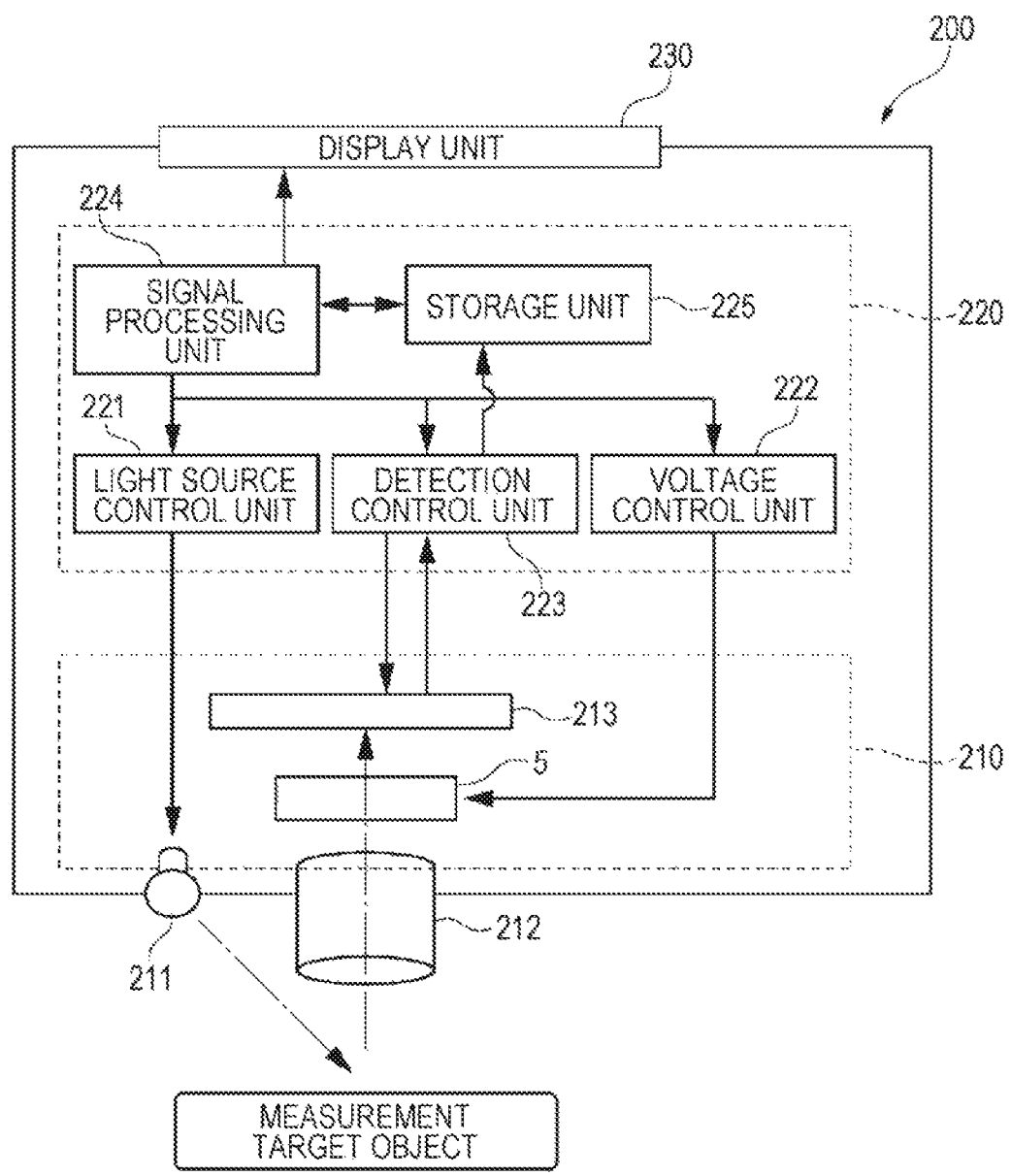
FIG. 10 is diagram illustrating an outline configuration of a food component analysis apparatus that is an example of an electronic device according to the invention.

FIG. 10 is a diagram illustrating an outline configuration of a food analysis apparatus that is an example of electronic devices each using the wavelength variable interference filter 5.

As shown in FIG. 10, a food analysis apparatus 200 includes a detector 210 (an actuator apparatus), a control unit 220, and a display unit 230. The detector 210 includes a light source 211 that emits light rays; an imaging lens 212 into which light rays from a measurement target object are guided; a wavelength variable interference filter 5 that transmits light rays of a designated wavelength among light rays having been input from the imaging lens 212; and an imaging portion 213 (a detection portion) that detects the light rays having been transmitted by the wavelength variable interference filter 5.

Further, the control unit 220 includes a light source control unit 221 that controls turning on/off of the light source 211 as well as the degree of luminance of the light source 211 being in a turned-on state; a voltage control unit 15 that controls the wavelength variable interference filter 5; a detection control unit 223 that controls the imaging portion 213 and acquires an spectroscopic image having been imaged by the imaging portion 213; a signal processing unit 224 (an analysis portion); and a storage unit 225.

The food analysis apparatus 200 is configured such that, when its optical system is actuated, the light source 211 is controlled by the light source control unit 221 so as to irradiate the measurement target object with light rays emitted from the light source 211 itself. Further, light rays having been reflected at the measurement target object pass through the imaging lens 212, and then, enter the wavelength variable interference filter 5. The wavelength variable interference filter 5 is driven in accordance with the driving method having been described in the above first embodiment under control of the voltage control unit 15. Through this operation, it is possible to extract light rays of a target wavelength with high accuracy by using the wavelength variable interference filter 5. Further, the light rays having been extracted are imaged by the imaging portion 213 constituted by, for example, a CCD camera. The imaged light rays are accumulated in the storage unit 225 as a spectroscopic image. Further, the signal processing unit 224 acquires a spectroscopic image corresponding to each target wavelength by controlling the voltage control unit 15 such that the voltage control unit 15 sequentially changes the value of the voltage to be supplied to the wavelength variable interference filter 5 to a corresponding value.

Subsequently, the signal processing unit 224 obtains a set of spectral data for each pixel by performing arithmetic processing on pieces of spectroscopic data relating to the each pixel, and being included in the spectroscopic images having been accumulated in the storage unit 225. Further, for example, sets of spectral information related to food components are stored in advance in the storage unit 225. The signal processing unit 224 analyzes the obtained sets of spectral dada on the basis of the sets of spectral information relating to food components and being stored in the storage unit 225, and thereby obtains food components contained in an inspection target as well as their respective contained amounts. Further, it is also possible to calculate food calorie, freshness, and the like, from the obtained food components and respective contained amounts. Moreover, through the analysis of spectral distributions of the accumulated spectroscopic images, it is also possible to perform, for example, extraction of a portion where freshness is decreased in an inspection-target food, and further, it is also possible to detect foreign substances contained in an inspection-target food.

Further, the signal processing unit 224 performs processing for displaying information, having been obtained in such a way as described above, and indicating components, contained amounts thereof, calorie, freshness, and the like, on the display unit 230.

Further, a substance component analysis apparatus having the substantially same configuration as that of the food analysis apparatus 200, which is shown in FIG. 10 as an example of the substance analysis apparatuses, can be also utilized as a noninvasive measurement apparatus for other kinds of information than those of the aforementioned information. For example, such a substance component analysis apparatus can be used as a living-matter analysis apparatus for measuring and analyzing living-matter components, which are, for example, components of body fluid, such as blood. Further, for example, when a living-matter analysis apparatus for measuring components of body fluid, such as blood, is configured as an apparatus for detecting ethyl alcohol, the living-matter component analysis apparatus can be used as a drunk-driving prevention apparatus for detecting a drinking state of a vehicle driver. Further, the substance component analysis apparatus can be used as an electronic endoscope system provided with such a living-matter analysis apparatus.

Moreover, the substance component analysis apparatus can be used as a mineral analysis apparatus for performing analysis of mineral components.

Furthermore, the wavelength variable interference filter according to the above first embodiment of the invention, and an actuator apparatus and an electronic device according to the invention can be applied to the following apparatuses.

For example, through a method of changing the intensity of light rays of each of predetermined wavelengths along with elapse of time, it is also possible to carry data by using light rays of predetermined wavelengths. In this case, a configuration, in which a light receiving unit receives light rays of a specific wavelength having been transmitted by a wavelength variable interference filter provided in an optical module, makes it possible to extract data having been carried by the light rays of the specific wavelength. An electronic device that includes such an optical module for data extraction and that has the function of processing data carried by light rays of each of predetermined wavelengths also enables realization of optical communication.

An electronic device according to the invention can be embodied as a spectroscopic camera, a spectroscopic analyzer, or the like, which images a spectroscopic image obtained by causing a wavelength variable interference filter corresponding to the wavelength variable interference filter according to the first embodiment of the invention to disperse target light rays. Here, an infrared camera incorporating such a wavelength variable interference filter will be described below as an example of such a spectroscopic camera.

Figure 11:
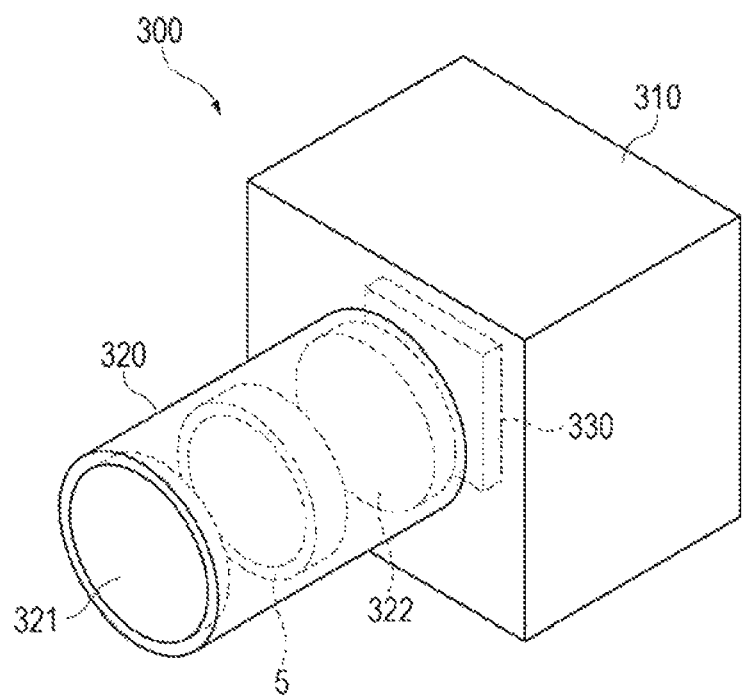
FIG. 11 is diagram illustrating an outline configuration of a spectroscopic camera that is an example of an electronic device according to the invention.

FIG. 11 is a schematic diagram illustrating an outline configuration of a spectroscopic camera. As shown in FIG. 11, a spectroscopic camera 300 includes a camera body 310; an imaging lens unit 320; and an imaging unit 330 (a detection portion).

The camera body 310 is a portion that is grasped and operated by a user.

The imaging lens unit 320 is provided in the camera body 310, and guides incident image light rays to the imaging unit 330. Further, as shown in FIG. 11, the imaging lens unit 320 includes an objective lens 321; an imaging lens 322; and a wavelength variable interference filter 5 interposed between these lenses.

The imaging unit 330 is constituted by a light receiving element and images the image light rays guided by the imaging lens unit 320.

The spectroscopic camera 300 is configured such that the wavelength variable interference filter 5 transmits light rays of a desired wavelength that is an imaging target, and thus, the spectroscopic camera 300 is capable of imaging a spectroscopic image of light rays of a desired wavelength. In this case, in the spectroscopic camera 300, a voltage control unit (not illustrated) drives, for each of target wavelengths, the wavelength variable interference filter 5 in accordance with the driving method having been described in the above first embodiment, thereby making it possible to extract image light rays of target wavelengths for target spectroscopic images.

Moreover, the wavelength variable interference filter according to the above first embodiment of the invention may be used as a band-pass filter. For example, the wavelength variable interference filter can be used as an optical laser apparatus for separating and transmitting only light rays that are among light rays being emitted from a light source element and falling within a predetermined wavelength band, and that falls within a narrow wavelength band whose center wavelength is placed on a predetermined wavelength.

Further, the wavelength variable interference filter according to the above first embodiment of the invention may be applied to a biological authentication apparatus. For example, the wavelength variable interference filter may be applied to an authentication apparatus that is for use in authentication using a blood vessel, a fingerprint, a retina, an iris, or the like, and that uses light rays of a near-infrared band or a visible band.

Moreover, an actuator apparatus and an electronic apparatus according to the invention can be embodied as a concentration detection apparatus. In this case, such a concentration detection apparatus is configured to, in order to measure an inspection-target concentration inside a sample, analyze spectra resulting from causing a wavelength variable interference filter to disperse infrared energy (infrared light rays) emitted from substances contained in the sample.

As described above, the wavelength variable interference filter according to the above first embodiment of the invention, and an actuator apparatus and an electronic device according to the invention may be applied to any apparatus that disperses incident light rays into spectra of predetermined wavelengths. Further, the wavelength variable interference filter according to the above first embodiment is capable of dispersing incident light rays into spectra of a plurality of wavelengths by itself, and enables realization of measuring spectra of a plurality of wavelengths and detecting a plurality of components with high accuracy. Accordingly, the wavelength variable interference filter according to the above first embodiment advances the downsizing of an optical module and an electronic device, which incorporate the wavelength variable interference filter, to a greater degree, as compared with existing apparatuses in which light rays of desired wavelengths are extracted by using a plurality of devices. Thus, the wavelength variable interference filter according to the above first embodiment can be suitably used as an optical device for portable apparatuses and in-vehicle apparatuses.

Moreover, in the above first embodiment, as an example of the actuator apparatus, the optical module provided with the wave length variable filter 5 has been described, but the invention is not limited to such an actuator apparatus.

For example, the invention can be applied to any actuator apparatus that includes a pair of substrates facing each other, and that changes the dimension of a gap between the pair of substrates. Examples of such an apparatus include a mirror device in which a mirror is disposed on one of a pair of substrates, and a direction in which light rays reflected at the mirror proceed is changed by changing an angle of the substrate on which the mirror is disposed (i.e., a mirror substrate) relative to the other one of the pair of substrates (i.e., a base substrate). In such a mirror device, to-be-changed angles of the inclination of the mirror are calculated in advance on the basis of an initial state in which the pair of substrates are in a mutually parallel state, and a desired angle selected from among the calculated angles is set. Thus, in the initial state, it is necessary to keep the mirror substrate in the state of being parallel to the base substrate. In this case, similarly to the above embodiment, configuration is made such that electrostatic actuators that can be mutually independently driven, and a gap detection portion that detects the dimension of a gap between the mirror substrate and the base substrate are provided between the mirror substrate and the base substrate, and an inclination state of the mirror substrate is detected by sequentially driving each of the electrostatic actuators. Further, for each of the electrostatic actuators, a parallel control voltage for bringing the mirror substrate into a state of being parallel to the base substrate is calculated from the detected inclination state.

Additionally, it is to be noted that concrete structures in the practice of the invention can be appropriately changed into other structures or the like within a scope in which the objective of the invention can be achieved.

What is claimed is:

1. An actuator apparatus comprising:
   a first substrate;
   a second substrate that faces the first substrate;
   a first reflecting film that is disposed on the first substrate;
   a second reflecting film that is disposed on the second substrate, the second reflecting film facing the first reflecting film;
   a plurality of bias electrostatic actuators that is disposed so as to surround the first reflecting film and the second reflecting film in plan view;
   a single control electrostatic actuator that is disposed so as to surround each of the first reflecting film and the second reflecting film in plan view;
   a gap detector that detects a gap between the first reflection film and the second reflection film based on a capacitance between the first reflection film and the second reflection film; and
   a driving controller that controls the plurality of bias electrostatic actuators and the control electrostatic actuator, the driving controller applying a bias voltage to one of the plurality of bias electrostatic actuators, the driving controller applying a feedback voltage to the control electrostatic actuator, the feedback voltage being generated based on the capacitance, the driving controller deriving a driving parameter to drive the one of the plurality of bias electrostatic actuators based on a voltage supplied to each of the plurality of bias electrostatic actuators and the gap at a time of the supply of the voltage thereto.

2. The actuator apparatus according to claim 1,
the driving controller calculating an inclination state between the first reflection film and the second reflection film, and a plurality of bias voltages for keeping the first reflection film and the second reflection film in a state of being parallel.

3. The actuator apparatus according to claim 2,
the driving controller applying a first voltage and acquiring a first variation amount of a dimension of the gap at a first time, and applying a second voltage and acquiring a second variation amount of the dimension of the gap at a second time to the one of the plurality of bias electrostatic actuators, the driving controller applying the first voltage and acquiring a third variation amount of the dimension of the gap at a third time, and applying the second voltage and acquiring a fourth variation of the dimension of the gap at a fourth time to another one of the plurality of bias electrostatic actuators, and the driving controller calculating the inclination state between the first reflection film and the second reflection film based on the first, second, third, and fourth variation amounts of the dimension of the gap.

4. The actuator apparatus according to claim 1,
the plurality of bias electrostatic actuators including a first bias electrostatic actuator, a second bias electrostatic actuator, a third bias electrostatic actuator, and a fourth bias electrostatic actuator.

5. The actuator apparatus according to claim 1,
the control electrostatic actuator also surrounding the plurality of bias electrostatic actuators.

6. An electronic device comprising:
the actuator apparatus according to claim 1; and
a processing controller that designates a target value of the gap to thereby control the actuator apparatus.

7. The actuator apparatus according to claim 1, wherein the single control electrostatic actuator is disposed to surround an entirety of each of the first reflecting film and the second reflecting film in the plan view.

8. A control method of an actuator apparatus comprising:
supplying a voltage to each of a plurality of bias electrostatic actuators;
detecting an amount of a gap between a first reflection film and a second reflection film based on a capacitance between the first reflection film and the second reflection film, the plurality of bias electrostatic actuators being disposed so as to surround the first reflection film and the second reflection film in plan view, a single control electrostatic actuator being disposed so as to surround each of the first reflection film and the second reflection film in plan view, a bias voltage being applied to one of the plurality of bias electrostatic actuators, a feedback voltage being applied to the control electrostatic actuator, the feedback voltage being generated based on the capacitance;
deriving a driving parameter to drive each of the plurality of bias electrostatic actuators on the basis of the voltage and the amount of the gap at a time of the supply of the voltage thereto.

9. The control method according to claim 8, wherein the single control electrostatic actuator is disposed to surround an entirety of each of the first reflecting film and the second reflecting film in the plan view.

* * * * *